(12) United States Patent
Kub et al.

(10) Patent No.: US 9,327,982 B2
(45) Date of Patent: *May 3, 2016

(54) METHOD OF FORMING GRAPHENE ON A SURFACE

(71) Applicants: Francis J. Kub, Arnold, MD (US);
Travis Anderson, Alexandria, VA (US);
Boris N. Feygelson, Springfield, VA (US)

(72) Inventors: Francis J. Kub, Arnold, MD (US);
Travis Anderson, Alexandria, VA (US);
Boris N. Feygelson, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 429 days.

This patent is subject to a terminal disclaimer.

(21) Appl. No.: 13/785,081

(22) Filed: Mar. 5, 2013

(65) Prior Publication Data

US 2013/0189444 A1 Jul. 25, 2013

Related U.S. Application Data

(62) Division of application No. 13/441,425, filed on Apr. 6, 2012, now Pat. No. 8,501,531.

(60) Provisional application No. 61/472,752, filed on Apr. 7, 2011.

(51) Int. Cl.
*B05D 3/02* (2006.01)
*C01B 31/04* (2006.01)
(Continued)

(52) U.S. Cl.
CPC ........... *C01B 31/0446* (2013.01); *B82Y 30/00* (2013.01); *B82Y 40/00* (2013.01);
(Continued)

(58) Field of Classification Search
CPC .... C01B 31/0446; B82Y 40/00; B82Y 30/00; H01L 21/0332; H01L 21/02527; H01L 21/02612; H01L 29/78642; H01L 29/78684; H01L 29/4908; H01L 29/475; H01L 29/2003; H01L 29/42316; H01L 29/1606; H01L 23/53276; H01L 29/66462; H01L 29/7787
USPC ................ 427/525, 528, 249.1, 249.2, 249.4, 427/374.1, 374.2
See application file for complete search history.

(56) References Cited

U.S. PATENT DOCUMENTS 8,501,531 B2 * 8/2013 Kub et al. .......... 438/99
8,647,918 B2 * 2/2014 Kub et al. .......... 438/99
(Continued)

OTHER PUBLICATIONS

A.K. Geim and A.H. MacDonald, "Graphene: Exploring Carbon Flatland," Phys. Today 60, 35 (2007), pp. 35-41; Mar. 2007.
(Continued)

*Primary Examiner* — Marianne L Padgett
(74) *Attorney, Agent, or Firm* — US Naval Research Laboratory; Joslyn Barritt

(57) ABSTRACT

Methods of forming a graphene material on a surface are presented. A metal material is disposed on a material substrate or material layer and is infused with carbon, for example, by exposing the metal to a carbon-containing vapor. The carbon-containing metal material is annealed to cause graphene to precipitate onto the bottom of the metal material to form a graphene layer between the metal material and the material substrate/material layer and also onto the top and/or sides of the metal material. Graphene material is removed from the top and sides of the metal material and then the metal material is removed, leaving only the graphene layer that was formed on the bottom of the metal material. In some cases graphene material that formed on one or more side of the sides of the metal material is not removed so that a vertical graphene material layer is formed.

8 Claims, 17 Drawing Sheets

(51) Int. Cl.
*B82Y 30/00* (2011.01)
*B82Y 40/00* (2011.01)
*H01L 21/02* (2006.01)
*H01L 21/033* (2006.01)
*H01L 29/66* (2006.01)
*H01L 29/778* (2006.01)
*H01L 29/49* (2006.01)
*H01L 29/786* (2006.01)
*H01L 29/47* (2006.01)
*H01L 29/423* (2006.01)
*H01L 23/532* (2006.01)
*H01L 29/16* (2006.01)
*H01L 29/20* (2006.01)

(52) U.S. Cl.
CPC ... *H01L 21/02527* (2013.01); *H01L 21/02612* (2013.01); *H01L 21/0332* (2013.01); *H01L 29/475* (2013.01); *H01L 29/4908* (2013.01); *H01L 29/66462* (2013.01); *H01L 29/7787* (2013.01); *H01L 29/78642* (2013.01); *H01L 29/78684* (2013.01); *H01L 23/53276* (2013.01); *H01L 29/1606* (2013.01); *H01L 29/2003* (2013.01); *H01L 29/42316* (2013.01); *H01L 2924/0002* (2013.01)

(56) References Cited

U.S. PATENT DOCUMENTS

| | | | |
|---|---|---|---|
| 9,129,811 B2 * | 9/2015 | Cho | H01L 21/02664 |
| 9,187,332 B2 * | 11/2015 | Yoon | B82Y 30/00 |
| 9,236,432 B2 * | 1/2016 | Kub | H01L 29/66242 |
| 9,278,862 B2 * | 3/2016 | Choi | C01B 31/0446 |
| 2009/0155561 A1 * | 6/2009 | Choi et al. | 428/220 |
| 2010/0055464 A1 * | 3/2010 | Sung | 428/408 |
| 2010/0224851 A1 * | 9/2010 | Colombo et al. | 257/9 |
| 2011/0104442 A1 | 5/2011 | Yoon et al. | |
| 2011/0206934 A1 | 8/2011 | Bol et al. | |
| 2012/0074387 A1 | 3/2012 | King | |
| 2013/0099195 A1 * | 4/2013 | Seacrist et al. | 257/9 |
| 2014/0261998 A1 * | 9/2014 | Veerasamy | 156/247 |
| 2014/0308523 A1 * | 10/2014 | Veerasamy et al. | 428/408 |
| 2015/0292110 A1 * | 10/2015 | Wang | C23C 16/26 117/103 |

OTHER PUBLICATIONS

S. Bae, H. Kim, Y. Lee, X. Xu, J.S. Park, Y. Zheng, J. Balakrishnan, T. Lei, H.R. Kim, Y.I. Song, Y.J. Kim, K.S. Kim, B. Ozyilmaz, J.H. Ahn, B.H. Hong, S. Iijima., "Roll-to-roll production of 30-inch graphene films for transparent electrodes," Nature Nanotechnology, 5, 574 (2010), pp. 574-578; Aug. 2010.

Y. Lee, S. Bae, H. Jang, S. Jang, S.E. Zhu, S.H. Sim, Y.I. Song, B.H. Hong, J.H. Ahn., "Wafer-scale synthesis and transfer of graphene films," Nano Letters, 2010, 490 (2010), vol. 10; pp. 490-493.

J.L. Tedesco, B.L. VanMil, R.L. Myers-Ward, J.M. McCrate, S.A. Kitt, P.M. Campbell, G.G. Jernigan, J.C. Culbertson, C.R. Eddy, Jr, D.K. Gaskill, "Hall effect mobility of epitaxial graphene grown on silicon carbide," Appl. Phys. Lett. 95, 122102 (2009), Sep. 21, 2009; pp. 122102-122102-3.

P. Sutter, "Epitaxial graphene: How silicon leaves the scene," Nature Material 8, 171 (2009), pp. 171-172; Mar. 2009.

* cited by examiner

METHOD OF FORMING GRAPHENE ON A SURFACE

CROSS-REFERENCE

This application is a divisional of and claims the benefit of priority under 35 U.S.C. §120 based on U.S. patent application Ser. No. 13/441,425 filed on Apr. 6, 2012, which in turn is a nonprovisional of and claims the benefit of priority under 35 U.S.C. §119 based on U.S. Provisional Patent Application No. 61/472,752 filed on Apr. 7, 2011, both of which are hereby incorporated by reference into the present application in their entirety.

TECHNICAL FIELD

The present invention relates to graphene and methods of forming a graphene material on a material substrate or material layer.

BACKGROUND

Graphene material has been shown to have a mobility of more than 20,000 $cm^2/vs$. Both microwave transistors and logic circuits have been implemented using graphene material layers. For most microwave transistor and logic circuits, it is preferred that the graphene material be deposited on a dielectric surface or a semi-insulating or insulating substrate.

To date, the primary approaches to form a graphene material layer on a material surface have involved one of three methods.

The first method that has been used to form a graphene material layer on a surface is a peel-off/transfer method in which a single layer is peeled off from a graphite crystal using tape and transferred to the substrate. See A. K. Geim and A. H. MacDonald, "Graphene: Exploring Carbon Flatland," *Phys. Today* 60, 35 (2007).

CVD growth/transfer method in which graphene is formed on a film of metallic catalyst at temperatures of approximately 450-1000° C., and then transferred to a different substrate. See S. Bae, H. Kim, Y. Lee, X. Xu, J. S. Park, Y. Zheng, J. Balakrishnan, T. Lei, H. R. Kim, Y. I. Song, Y. J. Kim, K. S. Kim, B. Ozyilmaz, J. H. Ahn, B. H. Hong, S. Iijima, "Roll-to-roll production of 30-inch graphene films for transparent electrodes," *Nature Nanotechnology*, 5, 574 (2010); Y. Lee, S. Bae, H. Jang, S. Jang, S. E. Zhu, S. H. Sim, Y. I. Song, B. H. Hong, J. H. Ahn, "Wafer-scale synthesis and transfer of graphene films," *Nano Letters*, 2010, 490 (2010). Silicon-carbide (SiC) surface decomposition method in which a substrate of SiC, a semiconductor, is heat-treated at 1200-2000° C. to form graphene on the SiC surface. See J. L. Tedesco, B. L. VanMil, R. L. Myers-Ward, J. M. McCrate, S. A. Kitt, P. M. Campbell, G. G. Jernigan, J. C. Culbertson, C. R. Eddy, Jr, D. K. Gaskill, "Hall effect mobility of epitaxial graphene grown on silicon carbide," *Appl. Phys. Lett.* 95, 122102 (2009); P. Sutter, "Epitaxial graphene: How silicon leaves the scene," *Nature Material* 8, 171 (2009).

A major issue with the CVD growth/transfer approach is the introduction of defects in the graphene material film during the transfer process and the introduction of impurities into the graphene material layer during the transfer process. The CVD/growth/transfer approach is a more costly approach than an approach that would grow a graphene material layer directly on a material substrate or material layer. A major issue with graphene growth on SiC is that SiC substrates are currently available in diameters to 150 mm while silicon substrates are available in diameters to 300 mm. In addition, silicon substrates are much less costly than silicon carbide substrates.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention includes methods of forming a graphene material on a material substrate or material layer that is formed on a substrate. In many embodiments, it is desirable that the material layer be a dielectric material layer. The present invention further includes a method for making a vertical graphene material structure on a surface and also device structures that use a vertical graphene material structure made in accordance with the method described herein or otherwise.

In an exemplary embodiment of a first method for forming a graphene material on a material substrate or optional material layer in accordance with the present invention, metal material or carbon-containing metal material with a selected carbon concentration when heated to a first temperature is deposited on a top surface of the material substrate or, if present, an optional material layer. The metal material will be converted to a carbon-containing metal material with a selected carbon concentration at the carbon solubility in the metal for a first temperature by exposing the metal material to a carbon-containing vapor at a first temperature that also diffuses carbon into the metal, by depositing a carbon-containing material on the surface of the metal material and then heating to a first temperature that also diffuses carbon into the metal, or by implanting carbon atoms or carbon-containing molecules into the metal material and heating to a first temperature that also diffuse the carbon atoms in the metal. The first temperature is selected so that the carbon from the carbon vapor or the carbon from the deposited carbon-containing material diffuses into the metal material to form a carbon-containing metal material having a selected carbon concentration at the solubility of for carbon atoms in the metal material that is higher then the solubility of carbon in the metal material at a second temperature. The structure is then cooled at a selected rate and to a second temperature lower then the first temperature so that the carbon-containing metal material is over saturated with carbon and carbon atoms will diffuse to segregate and/or precipitate carbon atoms onto the top and bottom surfaces (and the optional side surfaces) of the metal material where it will be catalyzed to form graphene material, with the graphene material on the bottom surface of the metal material being formed at the interface of the bottom surface of the metal material and the material substrate or, if present, the optional material layer. Finally, the graphene material on the top surface of the metal material and then the metal material is removed, preferably by etching, leaving intact the graphene material that was grown on the bottom surface of the metal material at the interface between the metal material and the surface of the material substrate or optional material layer on the surface of the material substrate or optional material layer.

In an exemplary embodiment of a second method for forming a graphene material on a material substrate or material layer in accordance with the present invention, a carbon or carbon-containing material is formed on a top surface of the material substrate or, if present, an optional material layer, and a metal material is deposited on a top surface of the carbon or carbon-containing material. The thus-formed structure is then annealed to form graphene material on the bottom surface of the metal material. The graphene material is formed on the bottom surface of the metal material by a process of annealing to catalyze the carbon or carbon-containing material partially or wholly into graphene material at the bottom surface of the metal material or alternately by a process of annealing so that the carbon atoms from the carbon or carbon-containing material diffuse into the metal and then the carbon atoms segregating or precipitating on the metal material surfaces upon cooling where the carbon material on the metal material surfaces is catalyzed to form graphene material on the metal material surfaces. Finally, the graphene material on the top surface of the metal material and the metal material are removed, preferably by etching, leaving intact the graphene material formed on the bottom surface of the metal material on the material substrate or optional material layer.

In an exemplary embodiment of a third method for forming a graphene material on a material substrate or material layer in accordance with the present invention, metal material or nanoparticle metal material is deposited on a top surface of the material substrate or, if present, an optional material layer, and is optionally patterned. The metal material is optionally patterned by lift off approach or a subtractive etch approach. The metal material can be patterned so that the metal material will have vertical or near vertical sidewalls with an approximate angle to the substrate of 90 degrees. The metal material is then exposed to a carbon-containing vapor at a first temperature or, alternatively, a carbon-containing material is deposited on the metal, and the then heated at a first temperature so that the carbon diffuses laterally at the interface between the metal material and the material substrate or in the case that a material layer is present, at the interface between the metal material and material layer. The structure is then heated to a second selected temperature to catalyze the graphene material on the bottom of the metal material. Finally, the graphene material on the top surface of the metal material (if present) and the metal material are etched away, leaving intact the graphene material from the bottom surface of the metal material on the material substrate or optional material layer.

In an exemplary embodiment of a fourth method for forming a graphene material on a material substrate or material layer in accordance with the present invention, metal material or nanoparticle metal material is deposited on a top surface of the material substrate or, if present, an optional material layer so that there is at least one region of the surface of material substrate or material layer that is without metal on the surface, at least one region of the material substrate or optional material layer with metal material on the surface, and at least one patterned metal edge between the two regions. The metal material can be patterned by approaches known to those skilled in the art including lithography and lift off approach, lithography and a subtractive etch approach, or metal nanoparticle deposition approach. The metal material is then heated in an ambient having carbon-containing molecules or carbon atoms at a temperature so that the vapor pressure of the metal material is sufficient that metal atoms are desorbed (sublimed) from the metal material. Some of the metal atoms that desorb from the metal can go into the ambient above the material substrate or optional material layer and act as a ambient catalyst to catalyze carbon-containing molecules or carbon atoms in the ambient to form graphene material that is then deposited on the surface of the material substrate or optional material layer. The graphene material that is deposited on the surface of the material layer or optional material layer can act as a seed graphene material layer for the further lateral growth of graphene material from the sp3 bonding sites on the edge of the seed graphene material layer. Alternately, some of the metal atoms that are desorbed from the metal material will leave the surface and patterned edge of the metal material and then redeposit onto the surface of the material substrate or optional material layer on the material substrate surface or optional material layer surface adjacent to the patterned edge of the metal material. The metal atoms that are deposited onto the material substrate or optional material layer can act as a catalyst to nucleate graphene material from the carbon-containing molecules or carbon atoms in the ambient on the surface of the material substrate or optional material layer. The graphene material can form at the initial site of the metal atoms on the material substrate or material layer surface and act as a seed graphene material layer for the further lateral growth of graphene material from the sp3 bonding sites on the edge of the seed graphene material layer. The excess metal atoms and the metal material on the surface of the material substrate or material layer can be etched away after the graphene material has formed.

Aspects of the present invention also include methods for making vertical graphene material structures which can be used, for example, as gate materials in a transistor or vertical conducting channels in a vertical transistor. In accordance with the present invention, a metal material is deposited on a material substrate or material layer and is patterned so that the metal material structure will have vertical or near vertical sidewalls with an approximate angle to the substrate of 90 degrees. Graphene can be formed on the top and side surfaces of the metal material by, for example, exposing the metal material to a carbon-containing vapor and annealing to catalyze graphene onto the metal material as in the first exemplary method. Vertical direction etching is used to remove the graphene material from the top only of the patterned metal material, with the graphene sidewalls on the sides of the patterned metal material not being removed. Finally, the metal material is etched away, leaving only the vertical graphene sidewalls on the material substrate or the graphene material layer.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As described in more detail below, the present invention includes First, Second, Third, and Fourth Methods of forming a graphene material (GM) on a material substrate (MS) or material layer (ML) surface. The GM can be used in devices intended for electric conduction, spin conduction, or optical absorption parallel to the graphene material layer or can be used for electrical conduction, spin conduction or optical absorption perpendicular to the graphene material layer. The GM can also be used for electrochemical electrodes.

In all cases described below, formation of graphene material on a surface in accordance with the present invention can be obtained using temperatures in the range of about 400 to about 1050° C. and exposure times typically of about 30 minutes.

The GM can be in form of continuous graphene material (CGM), patterned graphene material (PGM) or nanoparticle graphene material (NGM), and except as noted, the methods described herein can be used to form any one of these types of material.

The present invention further includes a method for making a vertical graphene material structure (VGMS) on a material surface and includes device structures having a VGMS made in accordance with the method described herein or otherwise.

The methods for forming graphene material on a material substrate or material layer in accordance with the present invention will now be described in detail, with the enclosed Figures providing illustration of key aspects of the described methods.

Figure 1:
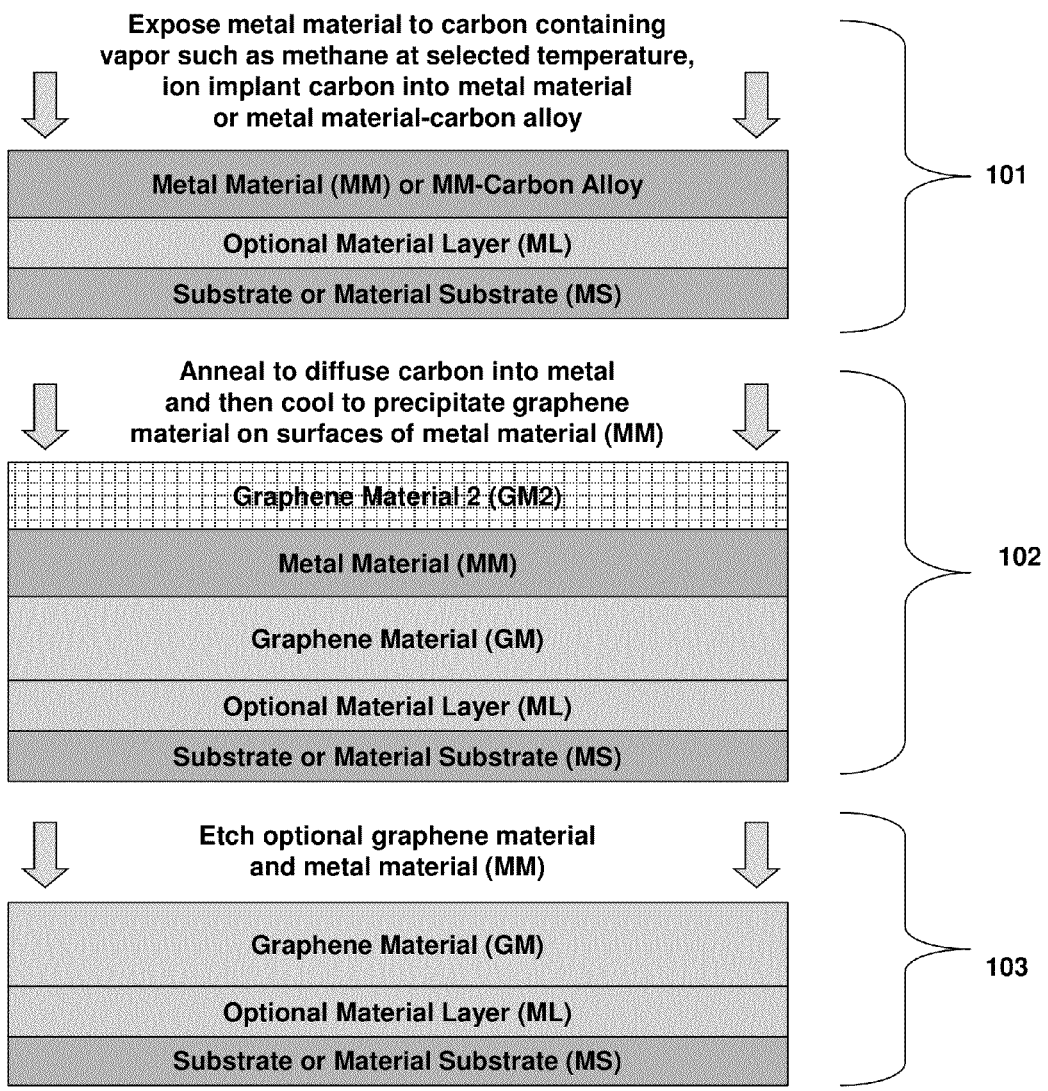
FIG. 1 depicts aspects of an exemplary embodiment of a first method for forming graphene on a surface in accordance with the present invention.
Figure 2:
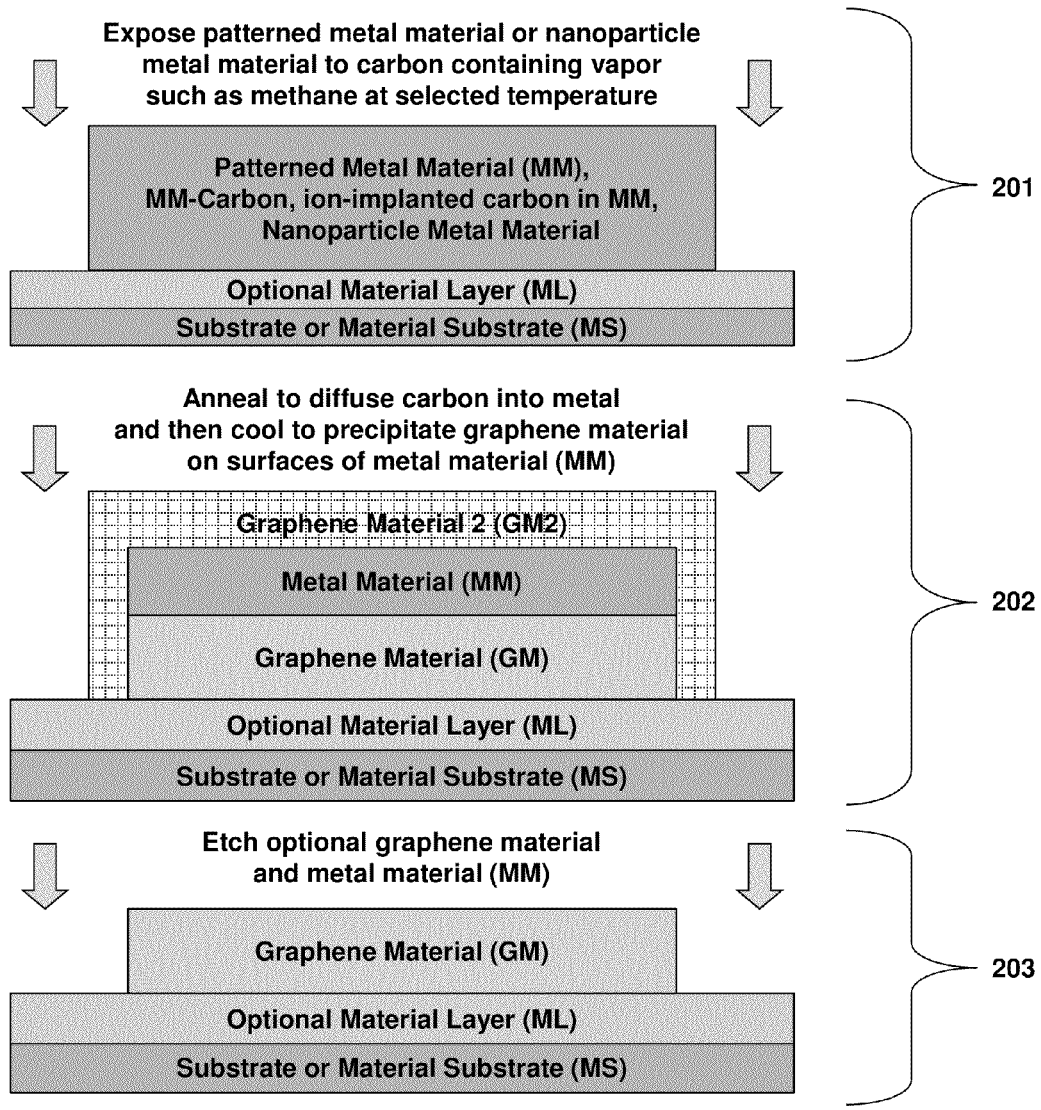
FIG. 2 depicts aspects of another exemplary embodiment of a first method for forming graphene on a surface in accordance with the present invention.
Figure 3:
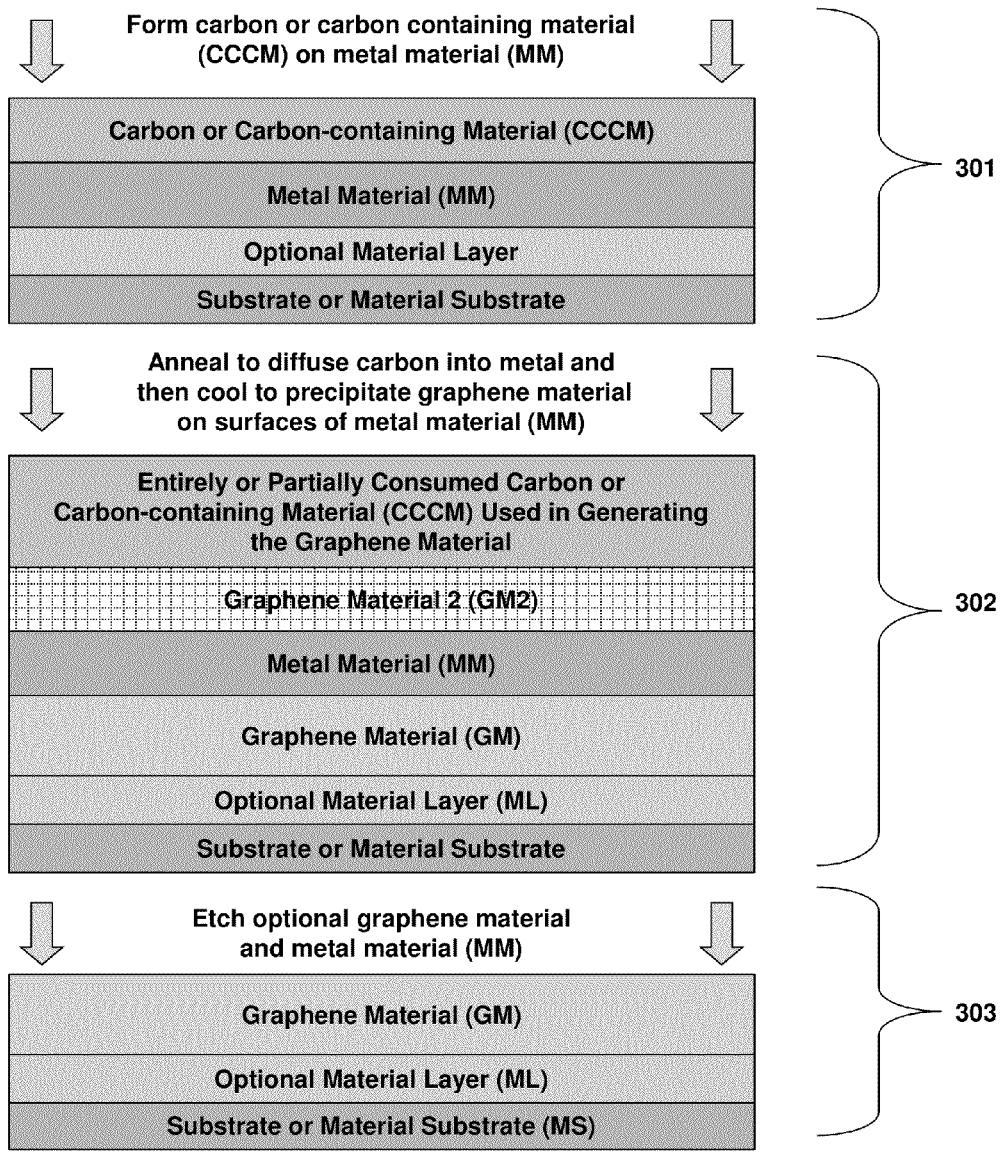
FIG. 3 depicts aspects of another exemplary embodiment of a first method for forming graphene on a surface in accordance with the present invention.
Figure 4:
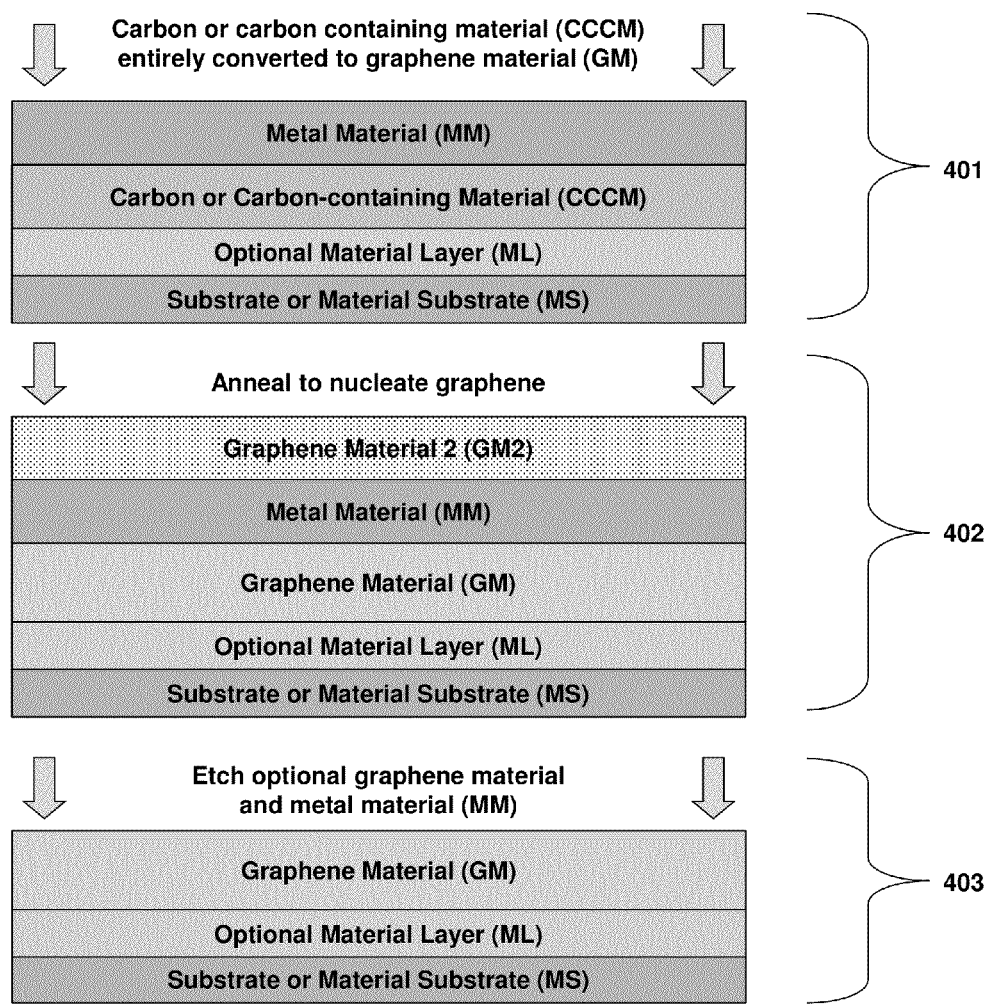
FIG. 4 depicts aspects of an exemplary embodiment of a second method for forming graphene on a surface in accordance with the present invention.
Figure 5:
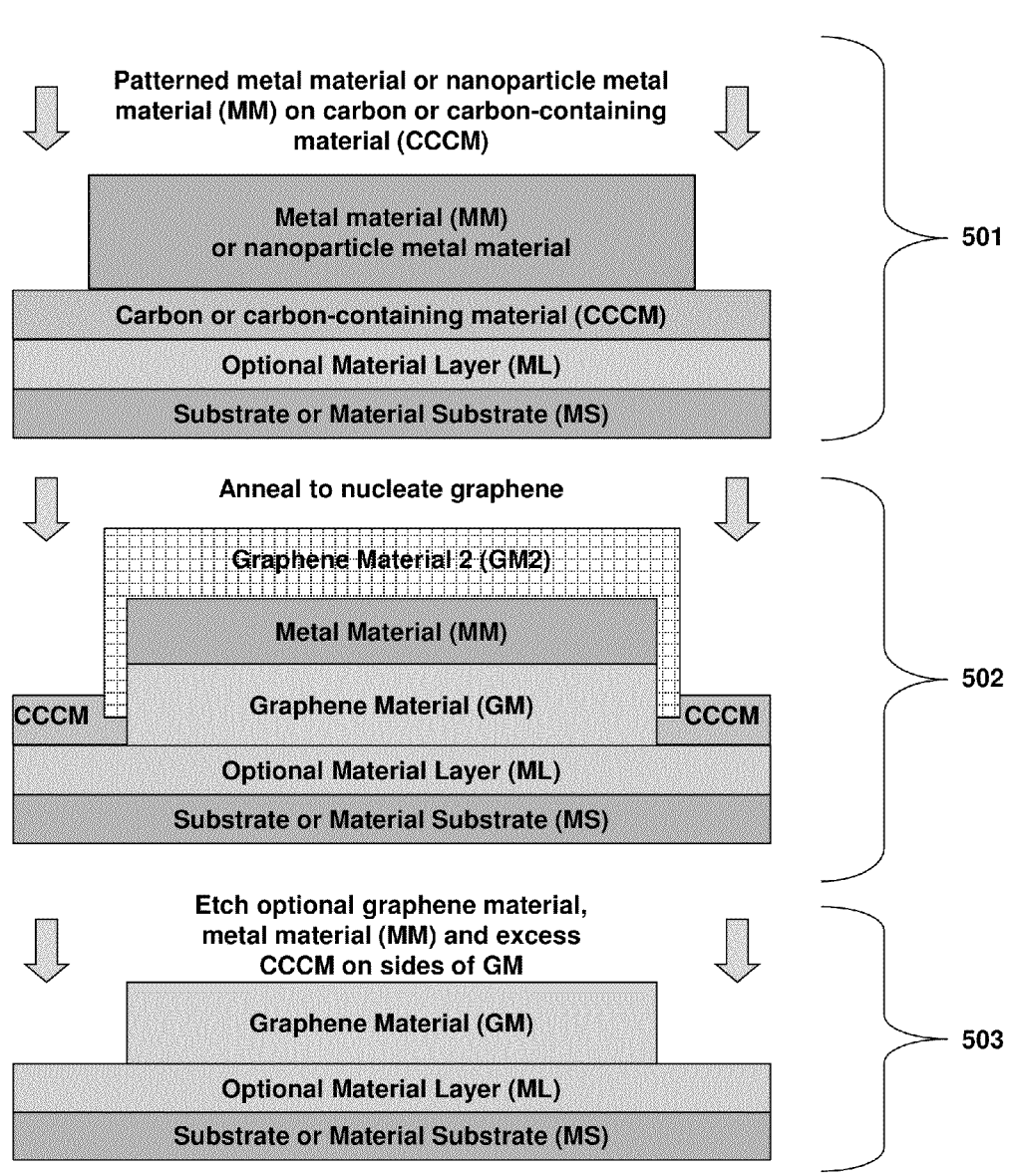
FIG. 5 depicts aspects of another exemplary embodiment of a second method for forming graphene on a surface in accordance with the present invention.
Figure 6:
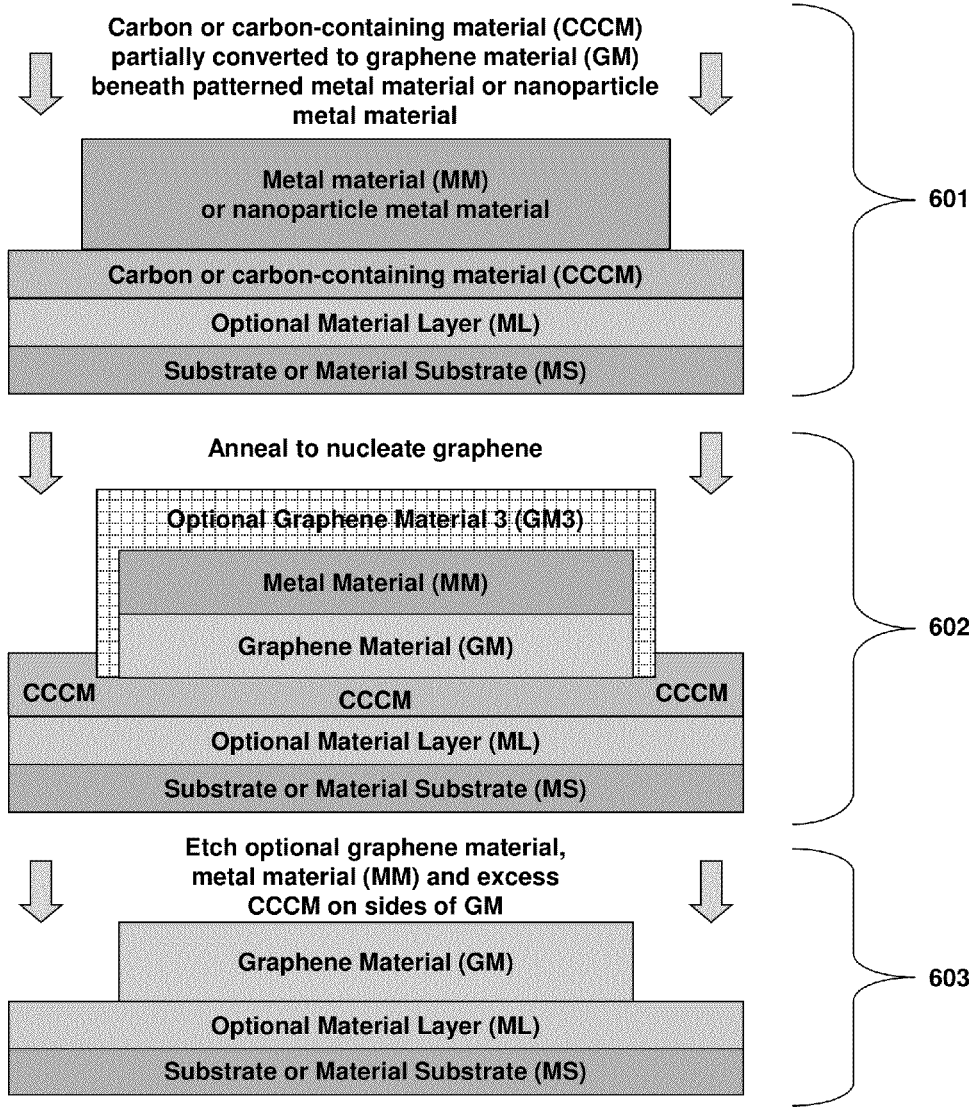
FIG. 6 depicts aspects of another exemplary embodiment of a second method for forming graphene on a surface in accordance with the present invention.
Figure 7:
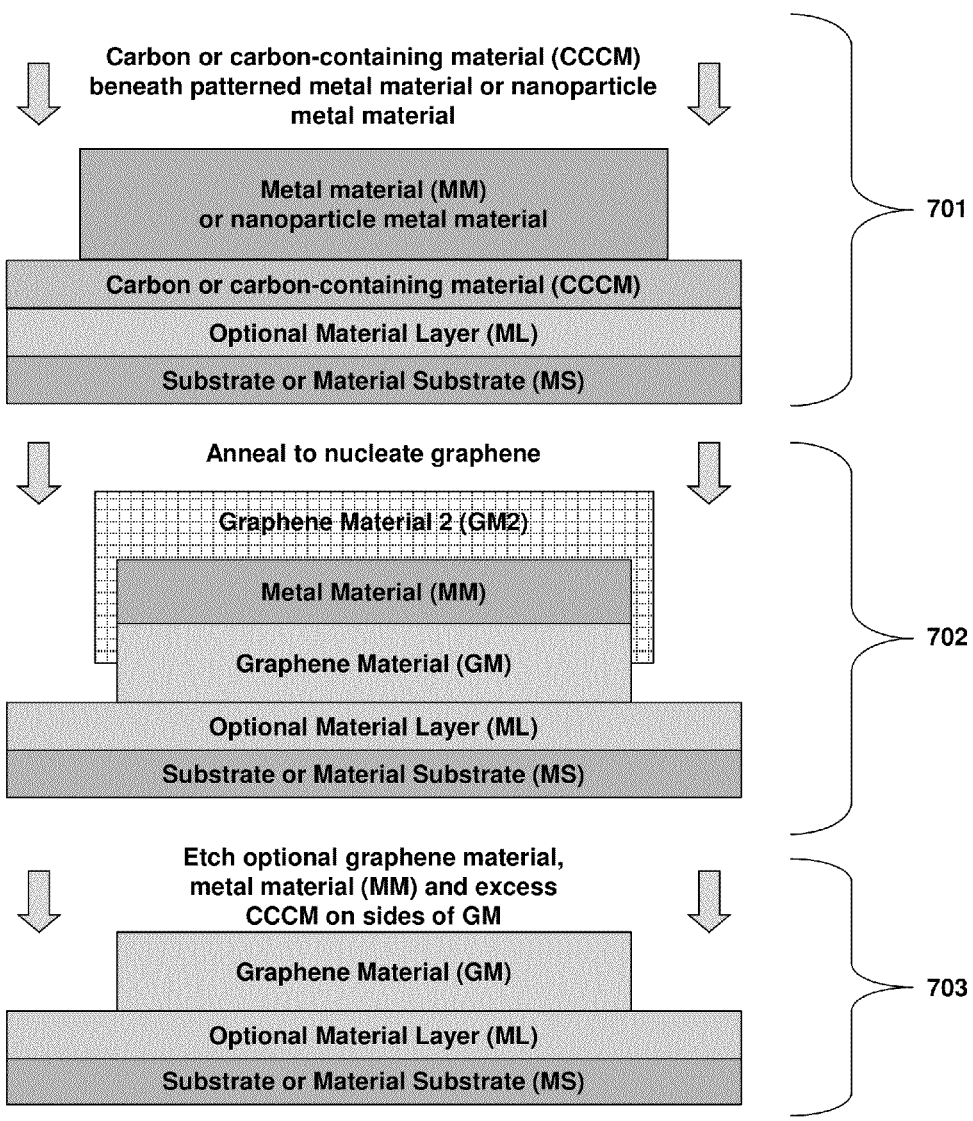
FIG. 7 depicts aspects of another exemplary embodiment of a second method for forming graphene on a surface in accordance with the present invention.
Figure 8:
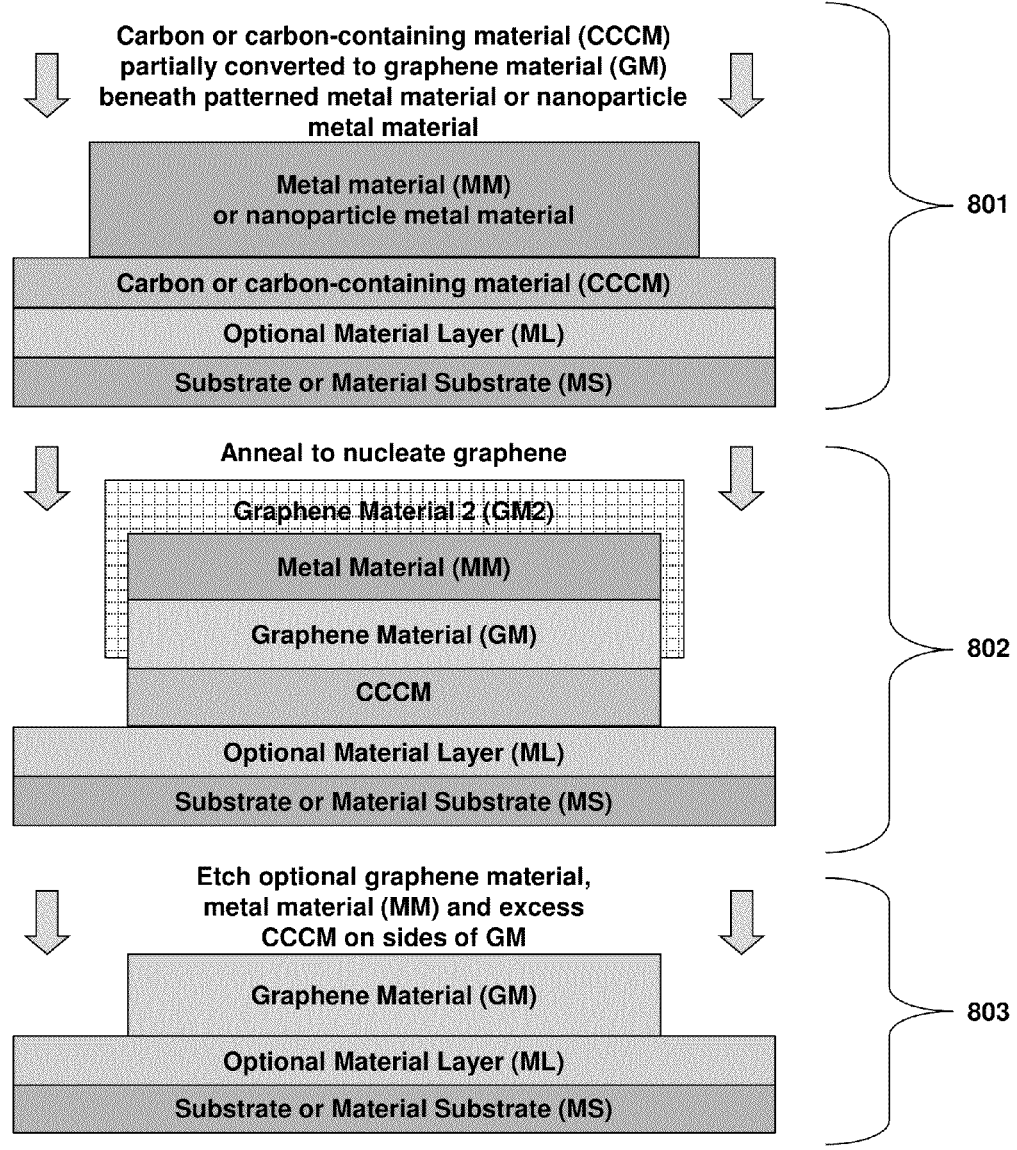
FIG. 8 depicts aspects of another exemplary embodiment of a second method for forming graphene on a surface in accordance with the present invention.

First Method—Diffuse Carbon into Metal Material or Implant Carbon into Metal Material, then Segregate and/or Precipitate Carbon on Surfaces of the Metal Material Layer, and then Catalyze the Carbon to Form Graphene Material on Metal Material Surface Aspects of a First Method for forming a graphene material on a material substrate or material layer in accordance with the present invention are illustrated in FIGS. 1, 2, and 3.

The approach in this First Method can be used to form a graphene material (GM) on a material substrate (MS) or material layer (ML). The material layer can comprise silicon oxide, aluminum oxide, hafnium oxide, indium tin oxide, silicon, gallium nitride, silicon carbide, gallium arsenide, indium phosphide, cadmium telluride, tungsten, molybdenum, titanium nitride, tungsten nitride, and other materials known to those skilled in the art.

As described in more detail below, a First Method of forming graphene material on a surface in accordance with the present invention includes the following steps:

(1) deposit a metal material (MM) on a material substrate (MS) or material layer (ML) surface and perform process steps to form a selected concentration of carbon within the metal material;

(2) apply a heating cycle to the carbon-containing MM to diffuse the carbon within the metal and then cool the carbon-containing MM to segregate and/or precipitate graphene material (GM) onto the bottom surface and precipitate additional graphene material (GM2) onto the top and/or side surfaces of the metal material;

(3) remove the GM2 from the top and side surfaces of the metal material; and (4) remove the MM layer without removing the GM that formed on the bottom of the MM and is in contact with the top surface of the MS or, if present, the ML.

Aspects of these steps are now described in more detail with respect to the embodiments illustrated in FIGS. 1 and 2, with the embodiment illustrated in FIG. 3 being described further below.

A First Method for forming graphene material on a surface in accordance with the present invention starts with formation of an MS layer. In preferred embodiments, the MS can be selected from the group comprising silicon, sapphire, silicon-on-insulator, quartz, gallium arsenide, gallium nitride, sapphire, indium phosphide, and cadmium telluride.

In some cases an ML can be deposited on the MS. An example is that for radiofrequency devices and digital logic circuits, it is desirable that the graphene material layer be separated from the material substrate by an insulating material layer. A typical example would be a silicon dioxide, silicon nitride, or boron nitride material layer on a conductive or high resistance silicon material substrate, The advantage of the silicon oxide, silicon nitride, or boron nitride material layer is that the material layer reduces the capacitance of source and drain junctions to the material substrate for transistors made in the graphene material layer and can provide electrical isolation between any two transistors made in isolated graphene material layers. Also, a boron nitride material layer on a material substrate can provide improved mobility for electron transport in the graphene material layer. Optionally, the material layer can be selected to be a material such AN or $Al_2O_3$ which has low interfacial reactivity for many transition metals for the temperatures that are used to crystallize graphene material on the bottom surface of the metal material.

The material used for the MS or ML can be an amorphous, glass, ceramic, polycrystalline, non-crystalline, highly-oriented, single-crystal, nanostructure, nanoparticle, or thin film material, a polymer material (likely using laser anneal for nucleating graphene from carbon material) a solar material, a photovoltaic material, a display material, a touch screen material substrate or material layer and can be a dielectric, insulator, semi-insulator, semiconductor, semi-metal, or metal. An optional candidate characteristic for the material used for the ML is low interfacial reaction with the MM, and materials that can be used for the ML include materials from the group comprising aluminum oxide, boron nitride, silicon nitride, silicon oxide, hafnium oxide, aluminum nitride, aluminum gallium nitride, gallium nitride, aluminum gallium arsenide, indium gallium arsenide, cadmium telluride, organic light emitting diode material, material as substrate for touch screen, thin film of photovoltaic material, thin film of material for display, barrier metal, and titanium nitride.

Once the MS with optional ML is formed, a MM layer (or in some cases, a metal material-carbon (MM-C) alloy layer) can be formed where the MM can include materials from the group comprising aluminum oxide, boron nitride, silicon nitride, silicon oxide, hafnium oxide, aluminum nitride, aluminum gallium nitride, gallium nitride, aluminum gallium arsenide, indium gallium arsenide, cadmium telluride, organic light emitting diode material, material as substrate for touch screen, thin film of photovoltaic material, thin film of material for display, barrier metal, and titanium nitride.

In an optional step, the MS or ML can be annealed prior to the deposition of the MM to increase the grain size and reduce grain boundaries in the material substrate or material layer or to reduce the amount of unbonded atoms or dangling bonds at the MS or ML surface and reduce the extent of the interfacial reaction of the MM with the MS or ML.

The MM and MM-C can be deposited by sputtering, e-beam evaporation, ion beam deposition, chemical vapor deposition, plasma enhanced chemical vapor deposition, atomic layer deposition and other techniques known to those skilled in the art. In some embodiments, the MM can be a continuous metal material (MM) layer as shown in FIGS. 1 and 3, or in other embodiments can be a patterned metal material (PMM) layer or a nanoparticle metal material (NMM) as shown in FIG. 2. The patterned metal material (PMM) can be defined using, e.g., a photolithography defined lift-off approach or a photolithography defined subtractive etch approach. The nanoparticle metal material layer can also be deposited by self-assembled monolayer approach, block-copolymer approaches, anodic alumina oxide stencil approaches, focused ion beam technique, or other approaches known to those skilled in the art. The metal nanoparticles can be dispersed on the surface of the MS or ML using aerosol and other approaches known to those skilled in the art. For ease of reference, all of these types of metal material layers will be referred to below as "MM" and "MM" will refer to all such types of metal materials except where specifically noted.

The material used for the MM layer can be selected from the group comprising copper, nickel, ruthenium, cobalt, iron, platinum, silver, zinc and other metals known to those skilled in the art, and can be selected for the preferred solubility limit for carbon in the metal material or for the diffusion characteristic of carbon into the metal material. For example, carbon diffuses into nickel and has a large solubility limit in nickel, while it has only a small solubility limit in copper.

The metal material is typically a transition metal. The metal material can be an alloy, a metal alloy, a metal composite, one or more metal nanostructures distributed on a surface, a lithography defined pattern of one or more metal nanostructures on a surface, a discontinuous film of metal atoms on a surface, a low surface density of metal atoms on a surface, a stacked layers of metal materials, or a structure of stacked metal and/or dielectric or semiconductor layers As noted above, in accordance with the first method described herein, in a first step (illustrated by element 101 in FIG. 1 and element 201 in FIG. 2) the MM is exposed to carbon to form a concentration of carbon within the MM. The concentration of carbon within the metal material (MM-C) can be formed using either carbon atoms or a metal material-carbon alloy using any suitable approach such as those described below.

For example the, MM-C can be deposited by sputtering (such as co-sputtering of the MM and carbon, sequential sputtering of the MM and carbon, or sputtering the MM in the presence of a carbon-containing ambient), e-beam evaporation, ion beam deposition, and other techniques known to those skilled in the art.

The MM-C can also be formed by ion implantation of carbon atoms or carbon-containing molecules into the MM.

Alternatively, the MM-C can be formed by exposing the MM to a carbon-containing vapor such as methane, acetylene, hexane, heptane, octane, etc. In this case, the MM can be exposed at a first selected temperature, which can be room temperature, such that carbon atoms absorb onto the surface of the MM. A second selected temperature, which can be the same as the first temperature or different, can then be chosen so that the carbon that is on the surface of the metal material diffuses into MM for a selected time so that the carbon achieves a selected concentration of carbon atoms or a selected distribution of carbon atoms in the in the MM. An optional selected carbon concentration in the MM is such that the carbon concentration is at the solubility limit for carbon atoms in the MM.

FIG. 3 illustrates an alternative manner of infusing carbon in to the MM in accordance with this First Method of the present invention. As shown in FIG. 3, the MM-C can be formed by depositing a carbon or carbon-containing material (CCCM) on the surface of the metal material (MM) at a first selected temperature, which can be room temperature, to form a CCCM layer on the surface of the metal material as illustrated in element 301 in FIG. 3.

The amount of CCCM that is deposited on the surface of the metal material can be selected to be an unlimited source of carbon for the carbon that diffuses into the metal. In the case of the unlimited source of carbon, some carbon will remain on the surface of the metal material after the second temperature cycle that diffuses carbon into the metal material. Alternately, the amount of carbon on the metal surface can be selected to be a limited amount of carbon so that carbon that is formed on the surface of the metal material substantially diffuses into the metal material and there are insubstantial amount of carbon or no carbon remaining on the surface of the metal material after the diffusion operation.

The CCCM layer can be deposited by a number of approaches. For example, a thin polymer layer can be deposited using a spin technique, a spray technique, or a dip and remove technique. Alternatively, a thin self-assembled monolayer can be deposited by a spray or dip approach using chemicals such as octadecanoic acid, octadecylphosphonic acid, steric acid, phosphonic acid isobenzen, and other chemicals known to those skilled in the art. A laminar Blodgett technique also can be used to deposit a thin polymer or self-assembled monolayer approach. In other cases, a thin carbon-containing material can be deposited on a material surface by exposing a material surface to a vapor of hexane, heptane, octane, etc. The carbon material layer can be selected from the group of material including deposited carbon layer, deposited amorphous carbon, deposited diamond like carbon, deposited carbon colloid, polymer, PMMA, MMA, self-assembled molecule layer, HMDS, hexane, heptane etc. A thin carbon layer can be deposited by sputtering, plasma deposition, e-beam deposition, ion beam deposition, pulse laser deposition and by other methods known to those skilled in the art.

Steps 2, 3 and 4 of the first method for forming graphene on a surface in accordance with the present invention are essentially the same for each of the embodiments shown in FIGS. 1, 2, and 3.

In a second step in the First Method for forming graphene material on a substrate in accordance with the present invention, illustrated in element 102 in FIG. 1, element 202 in FIG. 2, and element 103 in FIG. 3, the carbon-containing MM can be processed to diffuse the carbon out of the bulk and segregated and/or precipitate the carbon onto the surface of the MM in such a manner that graphene material is catalyzed (nucleated) on the surfaces of the MM, with the carbon atoms diffusing to the nucleation sites to form a graphene material layer.

Thus, in this step in accordance with the present invention, a selected temperature cycle with a selected cooling rate (which is typically a fast cooling temperature operation) is applied to change the solubility limit of carbon in the metal material so that the carbon is over saturated which causes the carbon to diffuse out of the bulk of the metal material (MM) and segregate and/or precipitate onto the surfaces of the MM. The temperature cycle can be in the form of a rapid thermal anneal or any other suitable heating/cooling cycle which causes carbon to precipitate out of the MM and onto the surface.

The carbon that is precipitated on the surface of the MM can then be catalyzed (nucleated) at sites on the MM surface, and the implanted carbon diffuses to the catalyzation sites to form graphene material on the surfaces of the MM. Thus, in accordance with the present invention, graphene material (GM) will be formed on the interface between the MM and the MS (or, if an ML is present, at the interface between the MM and the ML). Additional graphene material (denoted herein as "GM2") will also form on the other surfaces of the MM.

Thus, as shown in FIGS. 1, 2, and 3, GM forms at the bottom surface of the MM layer and GM2 forms at the top surface of the MM. In addition, in the case of a patterned MM layer as shown in FIG. 2, GM also forms on the side surfaces of the patterned MM In steps 3 and 4, illustrated by elements 103, 203, and 303 in FIGS. 1, 2, and 3, respectively, the GM2 and MM are removed without removing the GM that is in contact with the MS or ML.

Thus, in step 3 of the first method for forming graphene on a surface in accordance with the present invention, the GM2 is removed from the top and sides of the MM, e.g., by etching using an oxygen etch. In the embodiment shown in FIG. 3, this removal step also removes any of the remaining CCCM layer used in generating the GM and GM2.

Finally, in step 4, the MM layer is removed, e.g., by an etch process such as a chemical etch or a dry plasma etch so that the GM that is in contact with the MS or ML is not substantially removed by the etch process and remains on the surface of the MS or ML.

Thus, in accordance with this first method of the present invention, a graphene material layer can be formed by implanting carbon into a metal material layer disposed on a substrate so that graphene forms on the top, bottom, and any exposed side surfaces of the metal material layer, removing the graphene that forms on the top and sides of the metal material layer, and then removing the metal material layer so that only the graphene that was formed on the bottom of the metal material layer between the metal material layer and the substrate remains.

Second Method—Carbon or Carbon-Containing Material Beneath Metal Material Layer

The present invention also includes a second method for forming a graphene material layer on a material surface.

This second method, aspects of which are illustrated in FIGS. 4 through 8, utilizes a carbon or carbon-containing material situated beneath a metal material layer to produce the graphene material (GM).

The approach in this Second Method can be used to form a graphene material (GM) on a material substrate (MS) or material layer (ML) comprising silicon oxide, aluminum oxide, hafnium oxide, indium tin oxide, silicon, gallium nitride, silicon carbide, gallium arsenide, indium phosphide, cadmium telluride, tungsten, molybdenum, titanium nitride, tungsten nitride, and other materials known to those skilled in the art.

As described in more detail below, a Second Method of forming a graphene material (GM) of forming graphene material on a surface in accordance with the present invention includes the following steps:

(1) deposit carbon or a carbon-containing material (CCCM) on the surface of a material substrate (MS) or material layer (ML);

(2) deposit and optionally pattern a metal material (MM) layer on the surface of the carbon or carbon-containing material (CCCM);

(3) optionally perform a photolithography step to pattern the MM layer to selected regions by selective etch or lift off of the metal material layer or deposit metal material nanoparticles on the surface of CCCM;

(4) anneal the MM in such a manner that a graphene material (GM) is catalyzed (nucleated) from the CCCM that is in contact with the metal material at the bottom surface of the MM and optionally to form additional graphene material (GM2) on the top and/or side surfaces of the MM;

(5) remove the GM2, if present, from the top and sides of the MM layer; and (6) remove the MM layer without removing the GM from the surface of the MS or the ML.

Aspects of these steps are now described in more detail with respect to the embodiments illustrated in FIGS. 4 through 8.

A Second Method for forming a graphene material on a surface starts with formation of an MS with an optional ML layer. The formation of the MS/ML layers is described above with respect to the First Method and will not be repeated here.

Once the MS with optional ML is formed, in accordance with this Second Method for forming graphene on a surface in accordance with the present invention, a carbon or carbon-containing material (CCCM) is then deposited on the MS or, if present, ML.

In an optional step, the MS or ML can be annealed prior to the deposition of the CCCM to increase the grain size and reduce the density of grain boundaries in the material substrate or material layer or to reduce the amount of unbonded atoms or dangling bonds at the MS or ML surface and optionally reduce the extent of the interfacial reaction of the MM with the MS or ML.

In the next step, a carbon or carbon-containing material (CCCM) is deposited on the MS or ML, where the material used for the CCCM layer can be selected from the group of materials including deposited carbon layer, deposited amorphous carbon, deposited diamond like carbon, deposited carbon colloid, polymer, PMMA, MMA, self-assembled molecule layer, HMDS, hexane, heptane etc. The CCCM layer can have a thickness in the range from a submonolayer of carbon atoms or carbon-containing material atoms to a thickness of about 100 nm.

To avoid gas bubbles during the annealing step to form the graphene, it may be desirable that the CCCM be deposited with a physical vapor deposition (PVD) technique such as sputtering, plasma enhanced chemical vapor deposition, e-beam, pulse laser deposition, or ion beam deposition.

In other cases, the CCCM can be deposited as a polymer film, e.g., using a spin technique, a spray technique, or by a dip and remove technique. In such cases, excess solvents be removed from the polymer film prior to annealing. Using a vacuum anneal can also aid in removing solvents from the polymer. During the annealing step to form graphene on the surfaces of the MM, the polymer will decompose with hydrogen leaving the polymer film and carbon and other heavier atoms remaining in the layer.

The CCCM can also be deposited as a thin self-assembled monolayer using, e.g., a spray or dip approach. Chemicals that can form a CCCM self-assembled monolayer on a material surface or material layer include octadecanoic acid, octadecylphosphonic acid, steric acid, phosphonic acid isobenzen and other chemicals known to those skilled in the art. Alternatively, a laminar Blodgett technique can be used to deposit a thin polymer or self-assembled monolayer approach. A thin CCCM layer can also be deposited on a material surface by exposing a material surface to a vapor of hexane, heptane, octane, etc.

As shown in FIGS. 4 through 8, after the CCCM layer is formed, in a second step of a Second Method for forming graphene on a surface in accordance with the present invention, a MM layer is deposited on the top surface of the CCCM layer. The MM can be any suitable material as described above with respect to the First Method, and can be a continuous metal material (CMM) (FIG. 4) or can be a patterned metal material (PMM) or a nanoparticle metal material (NMM) (FIGS. 5, 6, 7, and 8) on the surface of the carbon or carbon-containing material (CCCM). In the case where the MM is a PMM or an NMM layer, it can be formed using any suitable means as described above with respect to the First Method. In addition, as described above with respect to the First Method, for ease of reference, all of these types of metal material layers will be referred to below as "MM" and "MM" will refer to all such types of metal materials except where specifically noted.

After the layered structure containing the CCCM and MM layers described above is formed, in accordance with the present invention as illustrated by elements 401/402, 501/502, 601/602, 701/702, and 801/802 of FIGS. 4, 5, 6, 7, and 8, respectively, the CCCM below the MM layer is converted to graphene.

A selected temperature cycle with a selected cooling rate (which is typically a fast cooling temperature operation) is then applied to the structure to catalyze (nucleate) graphene material (GM) onto the material substrate (MS) or material layer (ML), with the graphene nucleation initiating from the bottom surface of the metal material (MM) layer. The temperature cycle can be in the form of a rapid thermal anneal or any other suitable heating/cooling cycle which causes carbon to precipitate out of the MM and onto the MS (or ML) surface.

In this step of a Second Method for forming graphene on a substrate in accordance with the present invention, conversion to graphene is accomplished by annealing the layer structure in such a manner that a graphene material is initially catalyzed (nucleated) from the CCCM at the bottom surface of the MM. The CCCM can be totally (see FIGS. 4 and 7) or partially (see FIGS. 5, 6, and 8) consumed during the annealing step to form the graphene.

The GM formed in accordance with this step of the Second Method can consist of a material containing graphene material structures (MCGMS) or a material consisting entirely of graphene material structures (MEGMS). The MCGMS can comprise a carbon material, an amorphous carbon material, a hydrogenated carbon material, a fluorine carbon material structure, an oxide carbon material structure, a polymer/carbon material structure, or agraphene material structure (GMS). Material consisting entirely of graphene material structures (MEGMS) can be a layer of graphene material structures GMS that can be composed of contiguous GMS (GMS in contact with other GMS) beneath the MM or can be composed of discrete GMS (no or low percentage of GMS in contact with other GMS) beneath the MM. The GMS can comprise a single graphene sheet or stacked multiple graphene sheets. The GMS will typically have a graphene sheet or stacked multiple graphene sheets of limited dimension (i.e. domains of limited dimension). The GMS can have a lateral dimension in the range of 0.1 nm to 200 microns. There will typically be boundaries or grains between separate GMS. The GMS can be in random orientation relative to the MM or the material surface (MS).

It is known to those skilled in the art that copper nucleates a graphene material having a single sheet of graphene although there are cases where copper can be used to form up to three or four stack sheets of graphene. It is also known to those skilled in the art that nickel nucleates a graphene material having multiple stacked sheets of graphene. The method by which graphene forms for nickel is that the carbon from the CCCM diffuses into the bulk of the metal material and then up on fast cooling, precipitates on the surface of the nickel, and the nickel nucleates graphene at sites and additional carbon atoms diffuse to the nucleation sites to form graphene material. Thus, from this information, to form a graphene material consisting entirely of graphene material structure (MEGMS) for the case of copper metal material (MM), it would be necessary that the CCCM thickness be approximately one monolayer of carbon or less to form approximately a single sheet of graphene. If the CCCM thickness were more than one monolayer, it may be the case that one would form a composite consisting of a carbon material layer beneath a single sheet of graphene that is on the bottom surface of the copper metal layer. The composite material would be a material containing graphene material structures (MCGMS). If the metal material (MM) is nickel, a thicker layer of carbon or carbon-containing material (CCCM) can be consumed to form the multiple stacked graphene sheets.

In some cases the annealing step can be in the form of a laser anneal to nucleate the graphene material from the CCCM that is in contact with the bottom surface of the metal material. A laser anneal will keep the temperature of the material substrate (MS) or material layer (ML) low, allowing a polymer or glass material to be used as the MS or ML and thus, the laser anneal can be useful for forming graphene material (GM) electrodes on material layer (ML) used for photovoltaic material or material layer (ML) used for displays.

Alternatively, a rapid thermal anneal will permit the carbon to nucleate at sites on the metal material to form graphene material at the surface of the MM but will be sufficiently fast that there is insufficient time for the formed graphene material to decompose and dissolve into the bulk of the metal material.

Irrespective of the method used to precipitate the graphene, the graphene material (GM) that is formed will form not only on the bottom surface of the metal material but additional graphene material (GM2) will also form on any other exposed surface of the metal material, i.e., on the top of the metal material in all cases and on the sides in the case of a patterned metal material layer such as is shown in FIGS. 5, 6, 7, and 8 and in FIG. 9 described below.

In the step 5 step of the Second Method for forming graphene on a surface in accordance with the present invention noted above, as illustrated by elements 403, 503, 603, 703, and 803 in FIGS. 4, 5, 6, 7, and 8, respectively, the GM2 is removed from the top and sides of the MM, e.g., by etching using an oxygen etch. This removal step also removes any of the remaining CCCM layer used in generating the GM and GM2.

Finally, in step 6, the MM layer is removed, e.g., by an etch process such as a chemical etch or a dry plasma etch so that the GM that is in contact with the MS or ML is not substantially removed by the etch process and remains on the surface of the MS or ML.

Thus, in accordance with this Second Method of the present invention, a graphene material layer can be formed by forming a metal material layer on top of a carbon or carbon-containing material layer and processing the layered structure so that graphene forms on the top, bottom, and any exposed side surfaces of the metal material layer with the carbon or carbon-containing material being wholly or partially consumed during the graphene formation process, removing the graphene that forms on the top and sides of the metal material layer, and then removing the metal material layer and any remaining carbon or carbon-containing material so that only the graphene that was formed on the bottom of the metal material layer between the metal material layer and the substrate remains.

Third Method—Enhanced Lateral Diffusion of Carbon at the Metal Material/Material Layer Interface The present invention also includes a third method for forming a graphene material layer on a surface.

Figure 9:
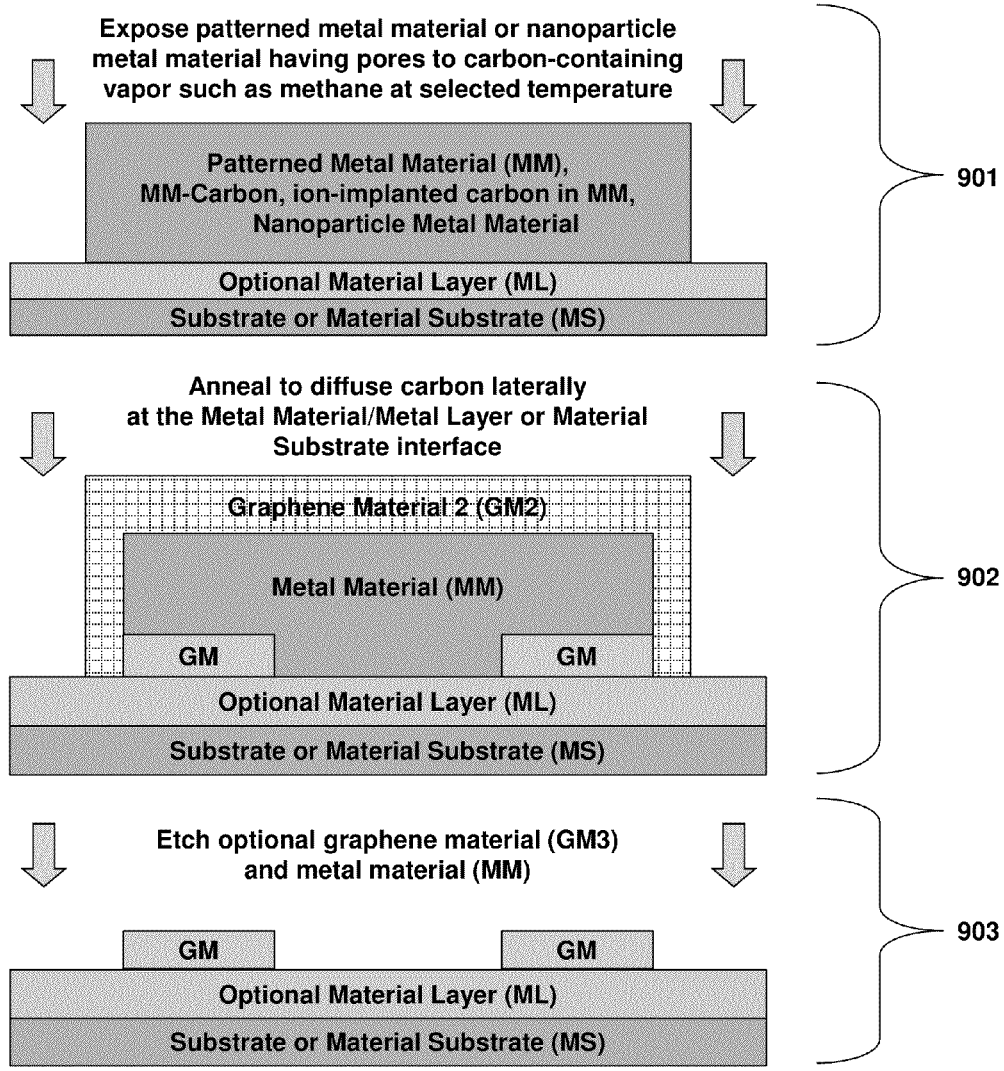
FIG. 9 depicts aspects of an exemplary embodiment of a third method for forming graphene on a surface in accordance with the present invention.

This approach, aspects of which are illustrated in FIG. 9, is similar to the First Method for the case in which the metal material (MM) is a patterned Metal Material (PMM) or nanoparticle metal material (NMM). In addition, in this embodiment, in addition to diffusion of carbon at a top surface of the MM as in the First Method, there can be lateral diffusion of carbon at the metal material/material substrate (MM/MS) or metal material/material layer (MM/ML) interface.

As described in more detail below, a Third Method of forming a graphene material (GM) on a surface in accordance with the present invention includes the following steps:

(1) deposit a metal material (MM) on a material substrate (MS) or material layer (ML) surface and perform process steps to form a selected concentration of carbon within the metal material;

(2) apply a heating/cooling cycle to diffuse the carbon laterally at the metal material/material substrate (MM/MS) or metal material/material layer (MM/ML) and cause graphene material (GM) to form on the MM/PMM/NMM surfaces and at the interface and optionally to form additional graphene material (GM2) on the top and/or side surfaces of the MM; and (3) remove the GM2 from the top and side surfaces of the MM; and (4) remove the MM without removing the GM from the surface of the MS or ML.

Aspects of these steps are now described in more detail with respect to the embodiment illustrated in FIG. 9.

A Third Method for forming graphene on a surface starts with the formation of a material substrate (MS) with an optional material layer (ML) in the same manner as described above with respect to the First and Second Methods of the present invention.

A metal material layer is then formed on the MS/ML layer. In this Third Method in accordance with the present invention, the MM layer is a patterned metal material (PMM) or a nanoparticle metal material (NMM) formed as described above with respect to the First Method. As with the First Method such patterned or nanoparticle metal material layers will be referred to in this section simply as "MM" for ease of reference, and it will be understood that in this section, "MM" will refer to such a patterned or nanoparticle metal material This MM layer is then infused with carbon in the same manner as described above with respect to the First Method, aspects of which are illustrated by element 901 in FIG. 9.

Thus, the MM layer is exposed to a carbon-containing vapor at a first selected temperature. The selected temperature can be chosen so that the carbon diffuses laterally at the metal material/material substrate (MM/MS) or the metal material/material layer (MM/ML) interface. The first selected temperature can be a temperature sufficient to nucleate graphene. Alternately, the first selected temperature can be below the temperature required to catalyze (nucleate) graphene, and an optional second selected temperature can be used to convert the carbon that has diffused laterally to graphene. It is not necessarily the case that the MM/MS or MM/ML structure be exposed to the vapor that contains carbon during the second selected temperature cycle.

In a next step, aspects of which are illustrated by element 902 in FIG. 9, the carbon-containing MM is then annealed to diffuse carbon and precipitate graphene onto the surfaces of the metal material. In this Third Method for forming graphene on a surface in accordance with the present invention, in addition to a "vertical" diffusion of graphene onto the top and side surfaces of the MM, there can be lateral diffusion of carbon at the MM/MS or the MM/ML interface. A candidate characteristic for selecting the material used for the MS and/or ML is that a strong interfacial reaction between the MS or ML and the MM does not exist so that carbon can diffuse laterally at this interface. Thus, as illustrated in element 902 of FIG. 9, the carbon that diffuses laterally at the MM/MS or MM/ML interface than then be nucleated into graphene material (GM) at the interface, with additional graphene material (GM2) being nucleated at the top and side surfaces of the MM in the same manner described above with respect to the First Method.

As with the First Method described above, the annealing can occur at a first selected temperature that can be chosen so that, in addition to diffusing at the exposed metal material surfaces, the carbon diffuses laterally at the MM/MS or MM/ML interface. The first selected temperature can be at a temperature sufficient to nucleate GM at the MM/MS or MM/ML interface. Alternately, the first selected temperature can be sufficient to cause the carbon to diffuse but bottom than the temperature required to nucleate graphene, with an optional second selected temperature being used to convert the carbon that has diffused laterally to GM at the MM/MS or MM/ML interface. It is not necessarily the case that the MM/MS or MM/ML structure be exposed to the vapor that contains carbon during the second selected temperature cycle. In addition to the graphene material (GM) thus formed at the interface, additional graphene material (GM2) will also be formed on the exposed metal material surfaces, i.e., on the top or on the sides, as described above with respect to the first method.

Once the GM and GM2 have been formed, in the next steps, aspects of which are illustrated by element 903 in FIG. 9, the GM2 that formed on the top surface or sides of the metal material layer is removed and finally, the MM layer is removed without removing the GM that formed at the MM/MS or MM/ML interface. The GM2 and MM layers can be removed by any suitable process. For example, the GM2 can be removed by etching, e.g., by an oxygen etch, while the MM can then be removed by a subtractive etch process. The GM formed at the interface will not be removed by the etch process and remain on the surface of the MS or ML.

Fourth Method—Graphene Material Adjacent Formed on Material Substrate or Material Layer Laterally Adjacent to a Metal Material The present invention also includes a fourth method for forming a graphene material layer on a surface.

Figure 10:
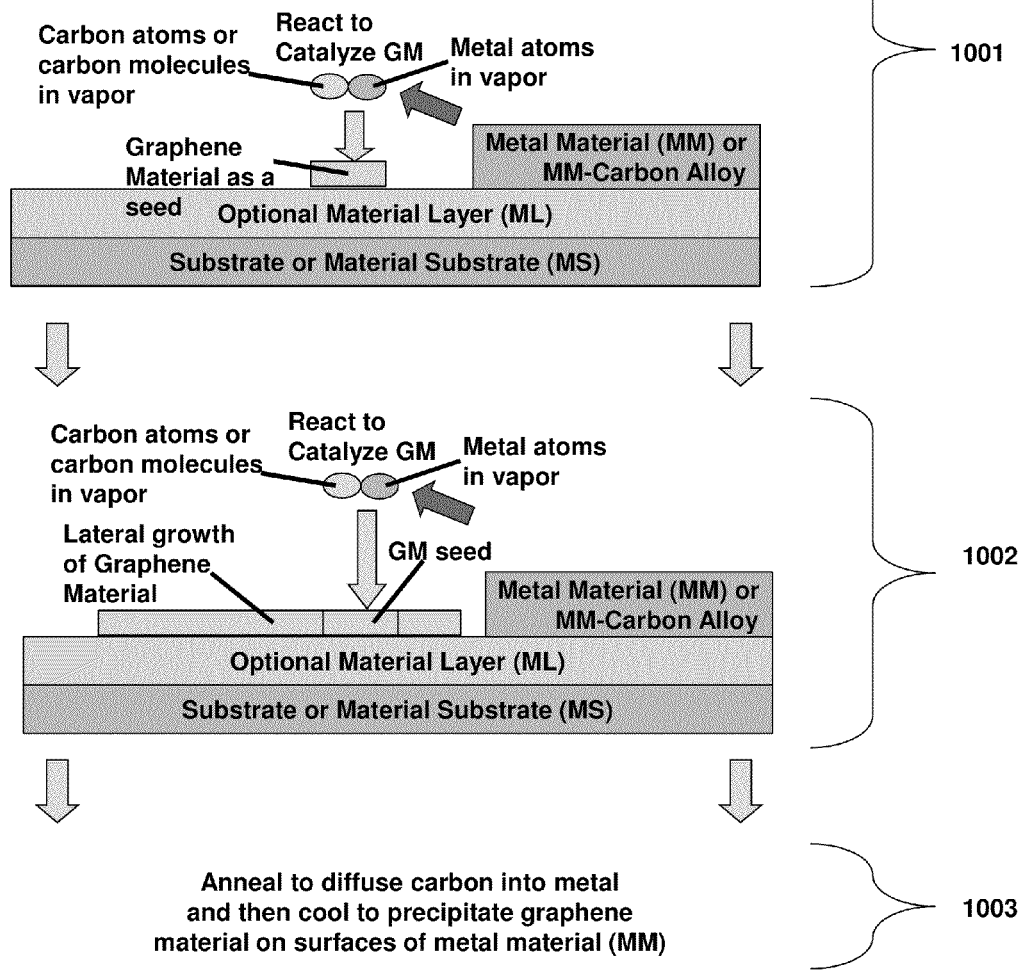
FIG. 10 depicts aspects of an exemplary embodiment of a fourth method for forming graphene on a surface in accordance with the present invention.
Figure 11:
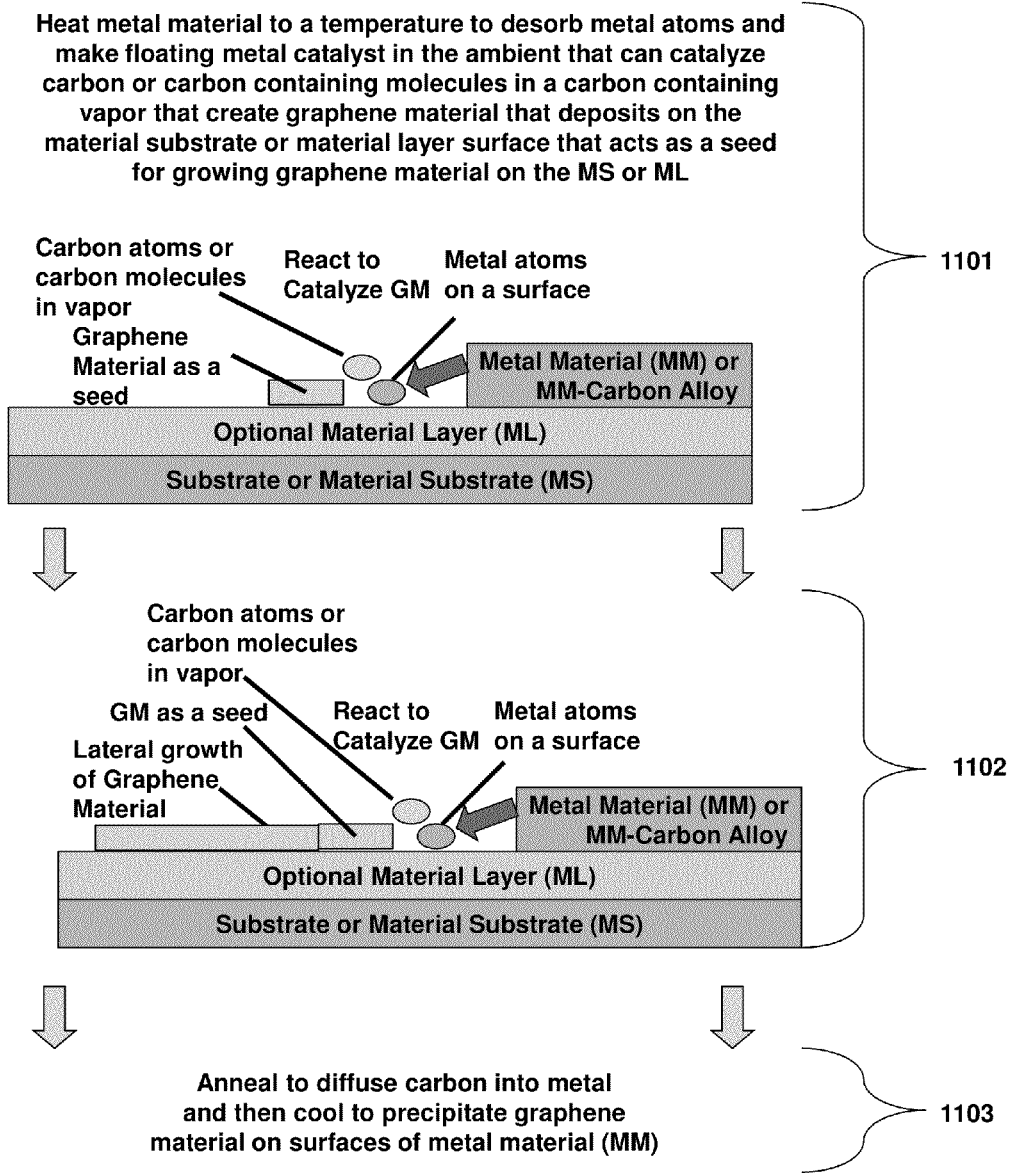
FIG. 11 depicts aspects of another exemplary embodiment of a fourth method for forming graphene on a surface in accordance with the present invention.

In this approach, aspects of which are illustrated in FIGS. 10 AND 11, the metal material (MM) is a patterned Metal Material (PMM) so that there is at least one region of the surface of material substrate or material layer that is without metal on the surface, at least one region of the material substrate or optional material layer with metal material on the surface, and at least one patterned metal edge between the two regions. The metal material can be patterned by approaches known to those skilled in the art including lithography and lift off approach, lithography and a subtractive etch approach, or metal nanoparticle deposition approach.

As described in more detail below, a Fourth Method of forming a graphene material (GM) on a surface in accordance with the present invention includes the following steps:

(1) deposit a metal material (MM) on a material substrate (MS) or material layer (ML) surface and pattern the metal material so that there is a region of the MS or ML where the MM is not on the surface;

(2) apply a heating cycle at a temperature so that the vapor pressure of the metal material is sufficient that metal atoms are desorbed (sublimed) from the metal material surface so that metal atoms enter the ambient above the metal surface while also introducing carbon atoms or carbon-containing molecules into the ambient so that both metal atoms and carbon atoms or molecules are present in the ambient at the same time. The metal atoms that are in the ambient can act as an ambient catalyst to catalyze the carbon atoms or carbon-containing molecules that are also in the ambient to first form graphene material in the ambient. The graphene material that is formed in the ambient can deposit onto the material substrate or material layer surface where the graphene material that is deposited can act as a seed layer for the further lateral growth of growth of graphene material on the material substrate or material layer surface from the sp3 bonding sites on the edge of the seed graphene material layer. Optionally if the sticking coefficient of the material substrate or material layer is properly selected, some of the metal atoms that desorbed from the metal material surface first into the ambient will be deposited onto the material substrate or material layer surface where the metal atoms can optionally bond to material substrate or material layer surface and reside as individual atoms or clusters of metal atoms. The carbon atoms or carbon molecules that are in the ambient can then adsorb onto the sites of the metal atoms or clustered metal atoms that are on the material substrate or material layer and be catalyzed to form graphene material at the location of the metal atoms or metal clusters where the graphene material can act as a seed layer for the further lateral growth of growth of graphene material on the material substrate or material layer surface from the sp3 bonding sites on the edge of the seed graphene material layer.

(3) continue applying the heating cycle while the surface of the material substrate or material layer is exposed to the carbon atom or carbon-containing ambient so that graphene material can continue to grow laterally on the surface of the material substrate or material layer for a selected time.

(4) optionally etch the metal atoms or the metal clusters to remove the metal from the surface of the material substrate or material layer after the graphene material has been formed.

Aspects of these steps are now described in more detail with respect to the embodiment illustrated in FIGS. 10 and 11.

A Fourth Method for forming graphene on a surface starts with the formation of a material substrate (MS) with an optional material layer (ML) in the same manner as described above with respect to the First, Second, and Third Methods of the present invention.

A metal material (MM) layer is then formed on the MS/ML layer. In this Fourth Method in accordance with the present invention, the MM layer is a patterned metal material (PMM) or a nanoparticle metal material (NMM) formed as described above with respect to the First Method. As with the First Method such patterned or nanoparticle metal material layers will be referred to in this section simply as "MM" for ease of reference, and it will be understood that in this section, "MM" will refer to such a patterned or nanoparticle metal material.

This MM layer is then heated to desorb metal atoms from the surface of the metal material which so that the metal atoms can act as ambient catalyst metal atoms for carbon atoms or carbon-containing molecules that at also in the ambient, aspects of which are illustrated by element 1001/1101 in FIGS. 10 and 11, respectively.

The metal atoms that are in the ambient can act as an ambient catalyst to catalyze the carbon atoms or carbon-containing molecules that are also in the ambient to first form graphene material in the ambient. The graphene material that is formed in the ambient can deposit onto the material substrate or material layer surface where the graphene material that is deposited can act as a seed layer for the further lateral growth of growth of graphene material on the material substrate or material layer surface from the sp3 bonding sites on the edge of the seed graphene material layer, aspects of which are illustrated by element 1002/1102 in FIGS. 10 and 11, respectively.

Additional graphene material can grow laterally from the location of the graphene seed that is deposited on the material surface or the material layer from continued exposure to carbon atoms or to carbon-containing molecules in the ambient, aspects of which are illustrated by element 1002 in FIG. 10.

The metal atoms that are desorbed form the MM layer can also absorb onto the material substrate or material layer surface and adhere to the material substrate or material surface if the sticking coefficient of the material substrate or material layer is properly selected, aspects of which are illustrated by element 1101 in FIG. 11.

The carbon atoms or carbon molecules that are in the ambient can then adsorb onto the sites of the metal atoms or clustered metal atoms that are on the material substrate or material layer and be catalyzed to form graphene material at the location of the metal atoms or metal clusters where the graphene material can act as a seed layer for the further lateral growth of growth of graphene material on the material substrate or material layer surface from the sp3 bonding sites on the edge of the seed graphene material layer, aspects of which are illustrated by element 1102 in FIG. 11.

As with the embodiment illustrated in FIG. 10, in the embodiment illustrated in FIG. 11, additional graphene material can grow laterally from the location of the graphene seed that is deposited on the material surface or the material layer from continued exposure to carbon atoms or to carbon-containing molecules in the ambient, aspects of which are illustrated by element 1102 in FIG. 11.

In both cases, in a final step, aspects of which are illustrated in element 1003/1103 in FIGS. 10 and 11, respectively, an annealing step can be performed to diffuse carbon in to the metal and then a cooling step can be performed to precipitate graphene material onto surfaces of the metal material.

A further optional step can also be performed to etch the metal atoms or the metal clusters to remove the metal from the surface of the material substrate or material layer after the graphene material has been formed for the case that metal atoms or metal cluster stick to the surface of the material substrate or material layer.

Device Structure and Method to Form Vertical Graphene Material Structures (Graphene Material Spacers)

The present invention also includes a vertical graphene material device and methods for forming such a vertical graphene material device.

As described below, aspects of this process can be also used to make vertical graphene material structures (VGMS). In accordance with these aspects of the present invention, a metal material structure is patterned, e.g. by photolithography and metal etching or lift-off, or by forming a metal sidewall spacer structure as described below so that that metal material structure (or structures) will have vertical or near vertical sidewalls with an approximate angle to the substrate of 90 degrees (approximately perpendicular to the substrate). It can be understood by those skilled in the art that the process of patterning the metal material can produce many vertical or near vertical sidewalls at the location of each edge of the photolithography patterned shapes and thus, there can be many VGMS formed on a material substrate or material layer. A metal material with vertical or near vertical sidewalls can also be made by forming a metal spacer or metal containing material spacer on the vertical sidewall of a patterned material structure by first depositing a metal material on the sidewall and/or top surface of the material structure and then using an RIE process or ion sputtering process that has substantially vertical oriented ions to etch the metal material removing the metal material from the top surface of the material structure and leaving a metal sidewall spacer as is known to those skilled in the art. The material structure can then be etched away so that a metal material with vertical or near vertical sidewalls remains. Graphene material can next be formed on the sidewalls of the metal material with vertical or near vertical sidewalls using the process described below. VGMS can also be formed on the sidewalls of metal nanowires.

After the metal material structures are formed that have vertical or near vertical sidewalls are formed, then a graphene material is formed on the sidewall surface and/or all surfaces using elements of the First Method described above. The elements of the First Method described above include the methods of exposing the surfaces of the metal material to carbon-containing vapor or carbon-containing material or alternately, the methods of forming carbon within the bulk of the metal and then having the carbon atoms segregate and/or precipitate onto the surfaces of the metal material upon rapid cooling. An addition method of forming carbon on the sidewall surface of the metal is by using a process of forming a carbon sidewall spacer in which carbon is deposited on the metal material so that at least some amount of carbon material is deposited on the metal material sidewall and then the carbon sidewall spacer is formed by anisotropic etching the carbon material using plasma etching on ion etching using a substantially vertical ion beam.

As discussed with respect to the First Method described above, carbon can be made to diffuse into a metal material with a high solubility for carbon such as nickel or alternately to segregate on the surface of the metal for metals with low solubility for carbon such as copper by exposing the metal material to a carbon-containing vapor at a selected temperature or depositing a carbon-containing material on the surfaces and heating to a selected temperature. Other approaches of forming carbon-containing metal include implanting carbon atoms or carbon-containing molecules into the metal material and depositing a carbon-containing metal material and annealing at a selected temperature. As stated above, an additional method of forming carbon on the sidewall surface of the metal is by using a process of forming a carbon sidewall spacer in which carbon is deposited on the metal surfaces and then a carbon sidewall spacer is formed on the sidewalls by anisotropic etching using plasma etching on ion sputtering with a substantially vertical ion beam, followed by a heating step to either diffuse the carbon into the metal for metals such as nickel or to segregate the carbon on the metal surface for metals with low carbon solubility such as copper.

After the carbon is diffused into the bulk of the metal, in the case of metals with a high solubility for carbon such as nickel, or formed in the bulk of the metal material by implanting carbon atoms or carbon-containing molecules or by depositing carbon-containing metal material, the carbon-containing material is rapidly cooled so that a portion of the carbon atoms in the bulk of the metal material can diffuse to the surface of the metal material and segregate and/or precipitate on the metal material surfaces and be catalyzed to form graphene material on the surfaces of the metal material layer. Typically, a graphene material with more than one sheet of graphene is formed for graphene material grown on nickel or iron.

Other metals such as copper have a low solubility for carbon in the metal and the process for forming graphene material does not require the diffusion of carbon into the metal. A graphene material can be formed on the surface of copper material by exposing the copper metal to a carbon-containing vapor or depositing a carbon-containing material on the surface of the copper metal and then heating to catalyze graphene material on the surface of the copper. Graphene material can also be formed on the surface of the copper material by implanting carbon into the copper metal material or by depositing copper metal material that contains carbon within the metal material and then heating so that the carbon with segregated and/or precipitate on the copper metal material surface and be catalyzed to a graphene material on the carbon metal surface. Typically, a graphene material with one sheet of graphene is formed for graphene material grown on copper, however, for some process conditions, more than one sheet of graphene can be grown.

Figure 12:
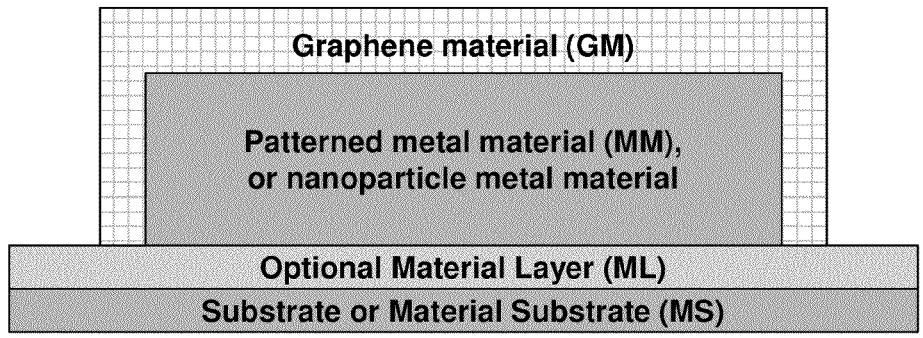
FIG. 12 depicts aspects of an exemplary embodiment of a method for forming a vertical graphene material structure in accordance with the present invention.
Figure 12:
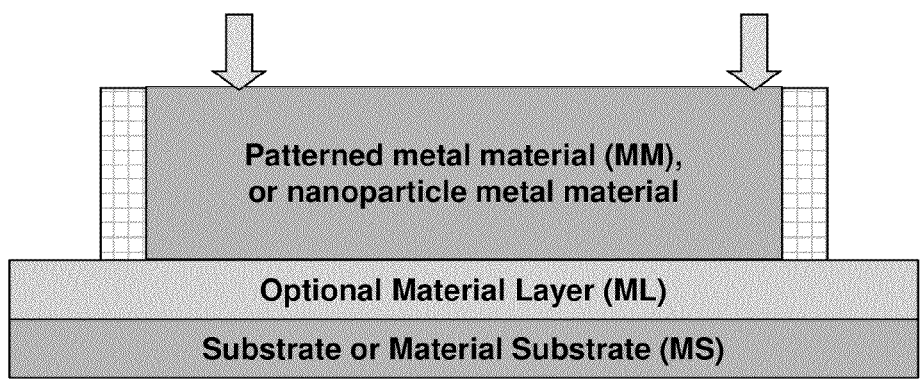
Figure 12:
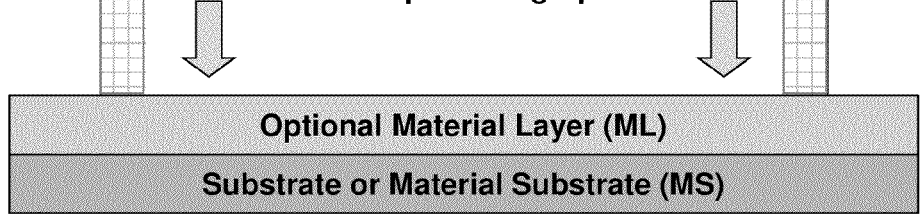
Figure 13:
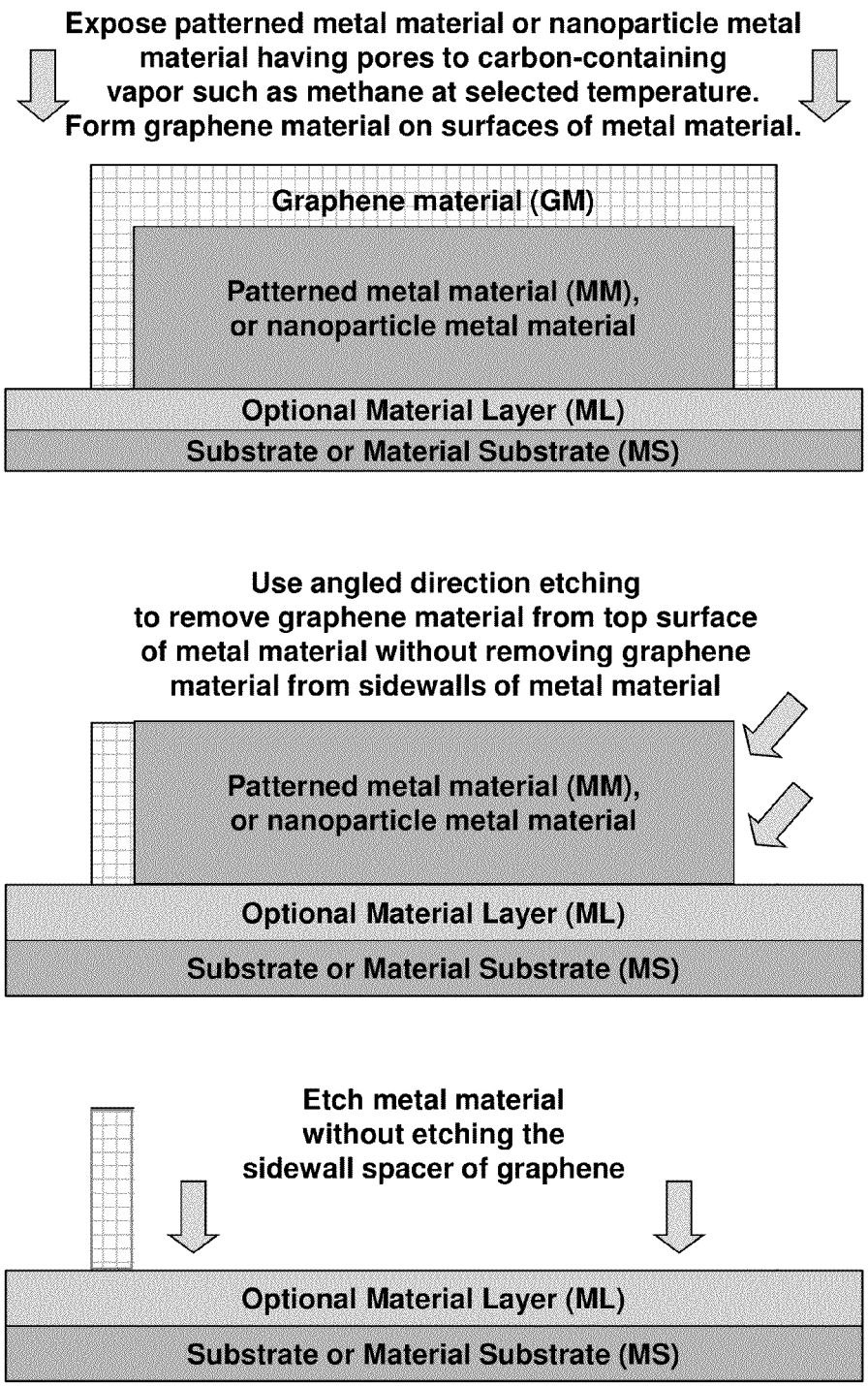
FIG. 13 depicts aspects of another exemplary embodiment of a method for forming a vertical graphene material structure in accordance with the present invention.
Figure 14:
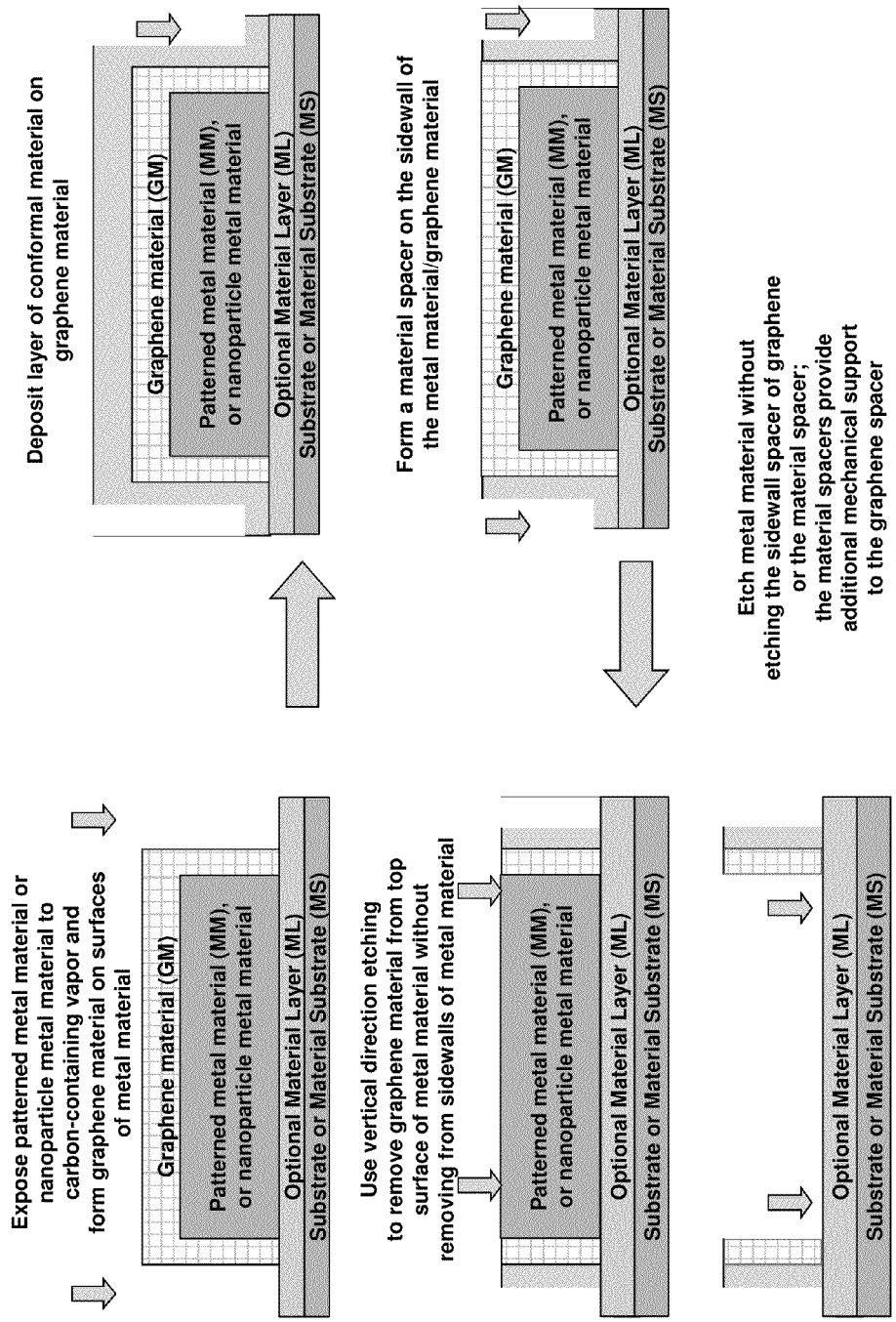
FIG. 14 depicts aspects of another exemplary embodiment of a method for forming a vertical graphene material structure in accordance with the present invention.

Aspects of a first approach of a method for making a VGMS are illustrated in FIGS. 12-14.

Thus, one approach to form a vertical graphene material structure in accordance with the present invention, aspects of which are illustrated in FIG. 12, uses an Reaction Ion Etcher (RIE) system that has a substantially vertically oriented directions for the ions with the RIE plasma or a substantially vertically orient ion beam to remove GM from the top surface of the MM layer, if GM is formed on the top surface of the MM (the process that uses a carbon sidewall spacer with copper metal will not typically have GM on the top surface of the MM) but not from the sidewalls of the MM layer so that the GM remains. The reactive ion etcher will typically use a plasma that contains atoms such as oxygen or fluorine but can contain other atoms molecules as well. A non-reactive beam of atoms such as argon ions can also be used to remove GM from the top surface of the surface of the MM layer. In another approach, aspects of which are illustrated in FIG. 13, uses a Reactive Ion Etcher (RIE) or sputter system that is configured to produce ions that are directed at the MM/MS or MM/ML at an angle relative to the normal direction from the MM surface (i.e., instead of being at a 90 degree orientation relative to the MM surface, the ion beam is at an angle that is different from 90 degree orientation so that the GM that is on one of the sidewalls of the patterned MM is removed while the GM that is on a second sidewall of the patterned MM is not removed.

In either case, the MM layer can then be removed, e.g., by a subtractive etch process as in the other methods described above, wherein any GM that is in contact with the MS or ML will not be removed by the etch process and will remain as a vertical graphene material structure (VGMS). The width of the VGMS can be in the range of approximately 0.3 nm to 1.8 nm and can form a ridge that has a length in the range of 0.3 nm to 20 mm or long depending on the height of the patterned metal material layer.

In some cases, it can be desirable that the metal material consist of a single-grain or metal material so that there are not grain boundaries present on the sidewall of the metal material so that there is small edge roughness on the metal material sidewall. For small dimension metal material structures, or for metal nanowires, or for metal material that is epitaxially grown from a metal material seed, it is possible for the metal material to have a single grain of metal. Alternately, in some cases, a metal with many small grains can be desirable to so that there will be less edge roughness on the metal material sidewall.

In another embodiment, aspects of which are illustrated in FIG. 14, additional mechanical support can be provided to the VGMS by forming a material spacer that is in contact with the VGMS. In this approach, a material layer such as silicon oxide is deposited so that silicon oxide material layer forms at least on one the sidewalls of the VGMS. A vertical RIE etch is next performed to for the material spacer on the sidewall of the VGMS. The metal material is next removed by chemical etching. The material layer can be a silicon oxide, silicon or other material.

Thus, the present invention provides methods for forming graphene directly on a surface without having to use the conventional approach of forming a graphene material layer on a second substrate and then transferring the graphene from the second substrate to a first substrate.

Figure 15:
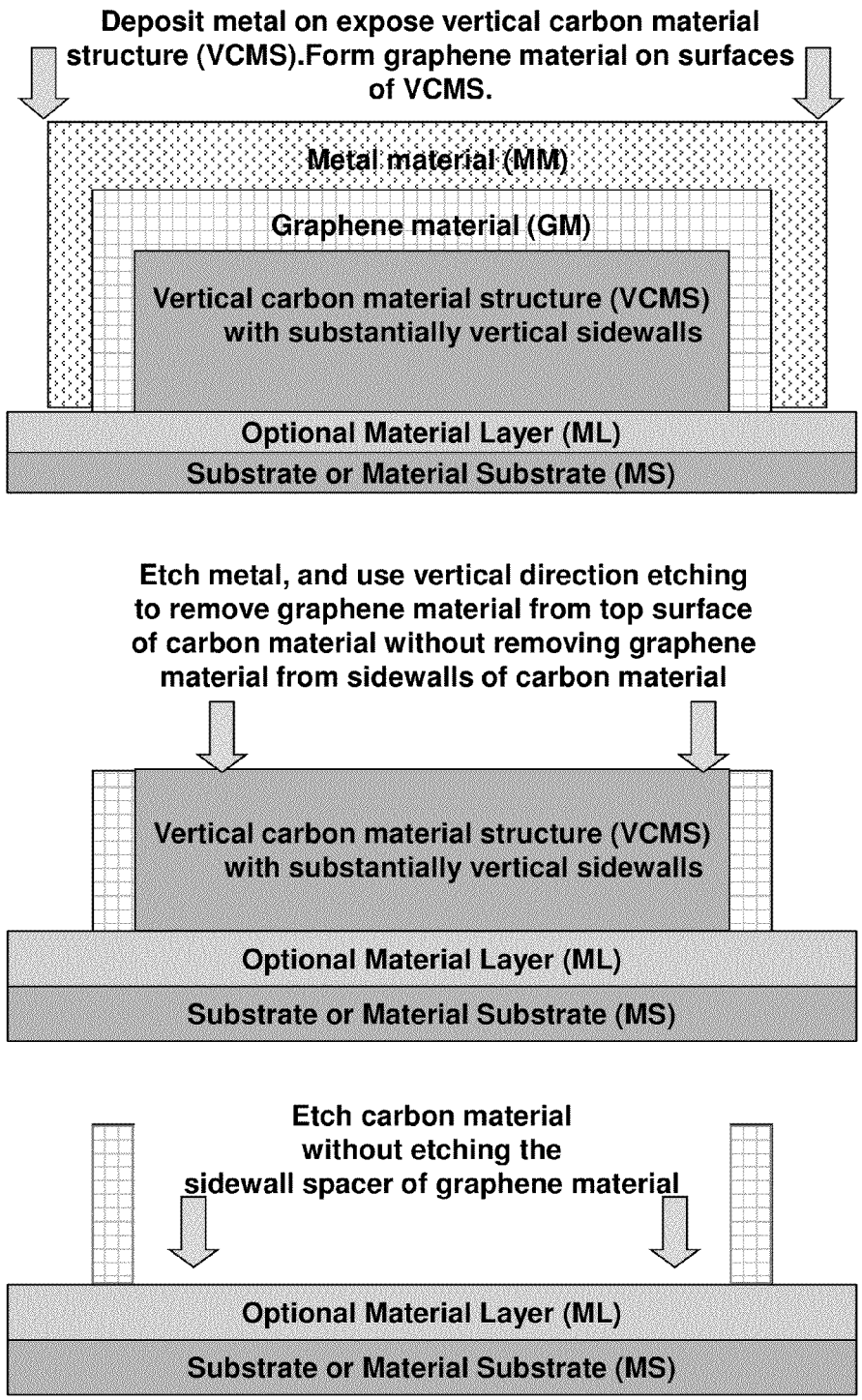
FIG. 15 depicts aspects of another exemplary embodiment of a method for forming a vertical graphene material structure in accordance with the present invention.

Still another approach to forming VGMS in accordance with the present invention is to first form a vertical carbon material structure (or carbon-containing material structure) (VCMS) having substantially vertical sidewalls, deposit metal atoms or metal material on the sidewalls and/or the top surface of the VCMS, form a vertical graphene material structure (VGMS) using elements of the approaches described in the First Method and Second Method, remove the metal material on the sidewalls and/or top surface of the VGMS by etching, and optionally remove the VCMS by etching in accordance with the present invention, aspects of which are illustrated in FIG. 15.

In accordance with these aspects of the present invention, a carbon material structure is patterned, e.g. by photolithography and carbon etching or lift-off, or forming a carbon sidewall spacer as described below so that that carbon material structure (or structures) will have vertical or near vertical sidewalls with an approximate angle to the substrate of 90 degrees (approximately perpendicular to the substrate). It can be understood by those skilled in the art that the process of patterning the carbon material can produce many vertical or near vertical sidewalls at the location of each edge of the photolithography pattern shapes and thus, there can be many VGMS formed on a material substrate or material layer. A carbon material with vertical or near vertical sidewalls can also be made by forming a carbon spacer or carbon-containing material spacer on the vertical sidewall of a patterned material structure by first depositing a carbon material on the sidewall and/or top surface of the material structure and then using an RIE process or ion sputtering process that has substantially vertical oriented ions to etch the carbon material removing the carbon material from the top surface of the material structure and leaving a carbon sidewall spacer as is known to those skilled in the art. The material structure can then be etched away so that a carbon material with vertical or near vertical sidewalls remains. Graphene material can be grown on the carbon material with vertical or near vertical sidewalls using the process described below. VGMS can also be formed on the sidewalls of metal nanowires.

After the carbon material structures are formed that have vertical or near vertical sidewalls are formed, then metal atoms or metal material is formed on the sidewall surface and/or top surface of the VCMS. The approach of depositing metal atoms or metal material on the sidewalls and/surface of the VCMS include methods such as atomic layer deposition, plasma enhanced chemical vapor deposition, ion beam deposition, metal nanoparticles deposition, exposing the VCMS to a metal vapor, or other process known to those skilled in the art for forming metal atoms or metal material on the sidewalls and/or top surface of the VCMS. In addition, a process of forming a metal material spacer on the vertical sidewall by first depositing a metal material on the side walls and/or on the top surface of the VCMS, and then etching the metal material using a plasma etcher or ion beam sputtering with substantially vertical ion direction can be used to form the metal material spacer on the VCMS sidewalls After or simultaneous with the metal atoms or metal material being formed on the VCMS sidewalls, a heating cycle can be used form graphene material at the interface between the metal material and the VCMS using elements of the First Method and Second Method described above. As discussed with respect to the First Method described above, carbon can be made to diffuse into a metal material with a high solubility for carbon such as nickel or alternately to segregate on the surface of the metal for metals with low solubility for carbon such as copper by exposing the metal material to a carbon-containing vapor at a selected temperature or depositing a carbon-containing material on the surfaces and heating to a selected temperature. Other approaches of forming carbon-containing metal include implanting carbon atoms or carbon-containing molecules into the metal material and depositing a carbon-containing metal material and annealing at a selected temperature. After the carbon is diffused into the bulk of the metal for the case of metals with a high solubility for carbon such as nickel or formed in the bulk of the metal material by implanting carbon atoms or carbon-containing molecules or by depositing carbon-containing metal material, the carbon-containing material is rapidly cooled so that a portion of the carbon atoms in the bulk of the metal material can diffuse to the surface of the metal material and segregate and/or precipitate on the metal material surfaces and be catalyzed to form graphene material on the surfaces of the metal material layer. Typically, a graphene material with more than one sheet of graphene is formed for graphene material grown on nickel or iron.

Other metals such as copper have a low solubility for carbon in the metal and the process for forming graphene material does not require the diffusion of carbon into the metal. A graphene material can be formed on the surface of copper material by exposing the copper metal to a carbon-containing vapor or depositing a carbon-containing material on the surface of the copper metal and then heating to catalyze graphene material on the surface of the copper. Graphene material can also be formed on the surface of the copper material by implanting carbon into the copper metal material or by depositing copper metal material that contains carbon within the metal material and then heating so that the carbon with segregated and/or precipitate on the copper metal material surface and be catalyzed to a graphene material on the carbon metal surface. Typically, a graphene material with one sheet of graphene is formed for graphene material grown on copper, however, for some process conditions, more than one sheet of graphene can be grown.

After the graphene material layer has been formed at the metal material/VCSM sidewall interface, a vertical graphene material structure (VGMS) can be formed in accordance with the present invention, aspects of which are illustrated in FIG. 15. The metal that is on the sidewall of the VCMS is first optionally removed by etching. Chemical etching can be used to remove the metal. Then an Reaction Ion Etcher (RIE) system that has a substantially vertically oriented directions for the ions with the RIE plasma or a substantially vertically orient ion beam to remove GM from the top surface of the graphene material layer, if GM is formed on the top surface of the VCMS (the process that uses a metal sidewall spacer with copper metal will not typically have GM on the top surface of the VCMS) but not from the sidewalls of the VCMS so that the GM remains on the sidewall of the VCMS. The reactive ion etcher or UV ozone etcher, or photoactivated etch will typically use a plasma that contains atoms such as oxygen or fluorine but can contain other atoms molecules as well. A non-reactive beam of atoms such as argon ions can also be used to remove GM from the top surface of the surface of the MM layer. A further approach, similar to the approach aspects of which are illustrated in FIG. 13, uses a Reactive Ion Etcher (RIE) or sputter system that is configured to produce ions that are directed at the MM/MS or MM/ML at an angle relative to the normal direction from the MM surface (i.e., instead of being at a 90 degree orientation relative to the MM surface, the ion beam is at an angle that is different from 90 degree orientation so that the GM that is on one of the sidewalls of the patterned MM is removed while the GM that is on a second sidewall of the patterned MM is not removed.

In either case, the VCMS can then be removed, e.g., by a subtractive etch process as in the other methods described above, wherein any GM that is in contact with the MS or ML will not be removed by the etch process and will remain as a vertical graphene material structure (VGMS). The width of the VGMS can be in the range of approximately 0.3 nm to 1.8 nm and can form a ridge that has a length in the range of 0.3 nm to 20 mm or long depending on the height of the patterned metal material layer.

The advantage of using carbon for the VCMS is that the carbon material can be amorphous carbon or other forms of carbon material such as diamond like carbon or hydrogenated amorphous carbon or hydrogen carbon that have a high density of sp3 bonds. Amorphous carbon is advantageous since it has essentially no grains and thus, VCMS can be formed with low edge roughness. The presence of grains can increase the edge roughness. A second advantage of using carbon material that has a high density of sp3 bonds for the VCMS is that the sp3 bonds can be highly reactive to oxygen ions forming Cox molecules while graphene with principally sp2 bonds is not highly reactive to oxygen ions and thus will not be readily etched when exposed to oxygen ions. Thus, the amorphous carbon material or other carbon material with a high density of sp3 bonds can be etched away leaving VGMS graphene material with sp2 bonds that are not etched.

In another embodiment of this method of forming a VGMS in accordance with the present invention, aspects of which are illustrated in FIG. 14 described above, additional mechanical support can be provided to the VGMS by forming a material spacer that is in contact with the VGMS. In this approach, a material layer such as silicon oxide is deposited so that silicon oxide material layer forms at least on one the sidewalls of the VGMS. A vertical RIE etch is next performed to for the material spacer on the sidewall of the VGMS. The metal material is next removed by chemical etching. The material layer can be a silicon oxide, silicon or other material.

Applications for a Vertical Graphene Material Structure (VGMS)

Figure 16A:
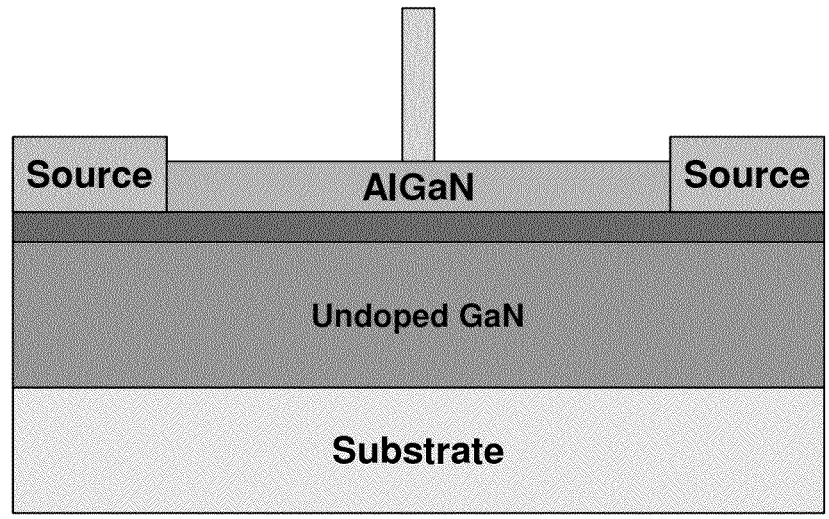
FIGS. 16A and 16B depict aspects of exemplary embodiments of graphene material formed in accordance with the present invention used as a gate material for a transistor.
Figure 16B:
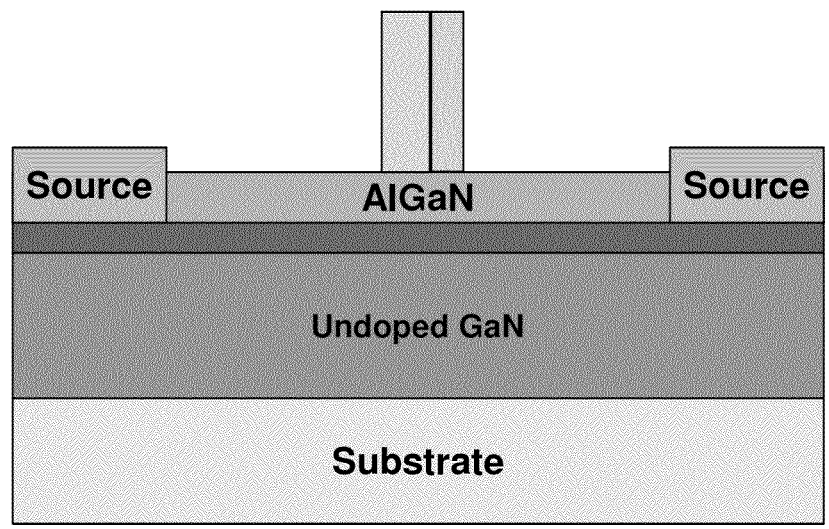
Figure 17A:
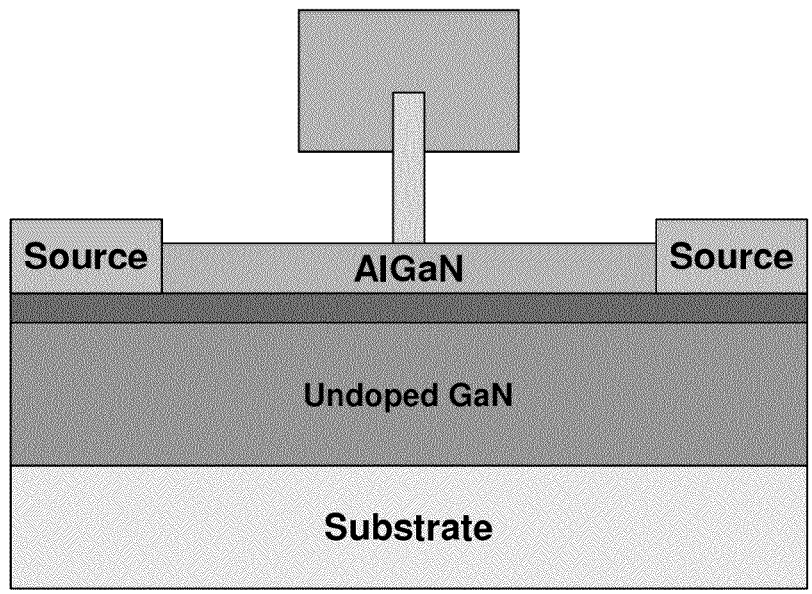
FIGS. 17A and 17B depict aspects of other exemplary embodiments of graphene material formed in accordance with the present invention used as a gate material for a transistor.
Figure 17B:
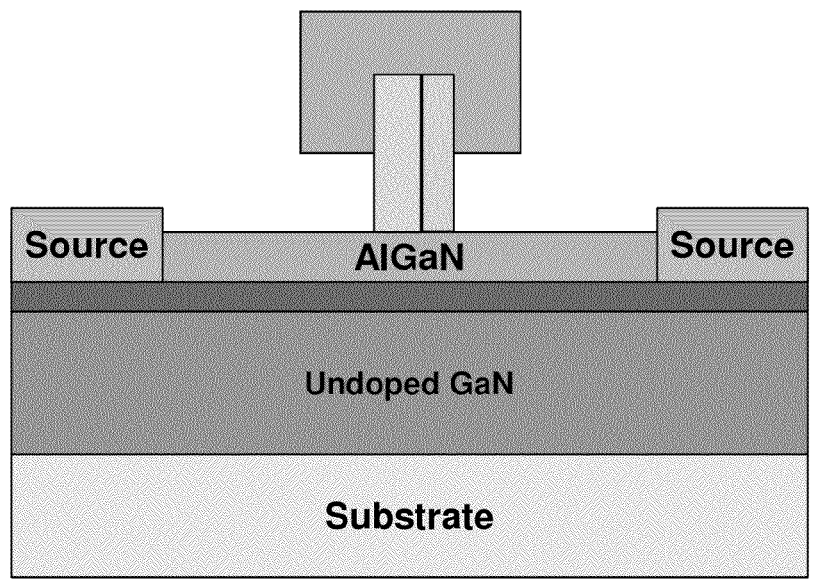

Applications for a vertical graphene material structure (VGMS) produced in accordance with the present invention include its use as a vertical current flow transistor, a graphene channel FINFET, sidewall spacer for a double patterning lithography process, for a triple patterning lithography process, as a gate electrode for a field effect transistor, an electron field emitter, a high surface area electrodes for electrodes for double layer capacitors, and other applications to those skilled in the art. Metal oxide nanoparticles such as $MnO_2$ and $RO_2$ nanoparticles can be grown on the VGMS to enhance the capacitance capability of double layer capacitor. Since the VGMS is as narrow as 0.3 nm wide, the VGMS can function as the gate electrode of a high performance field effect transistor, as illustrated in FIGS. 16A/16B. In other cases, a T-gate FET transistor can be formed by forming a metal material in contact with the top of the VGMS, as illustrated in FIGS. 17A/17B. The VGMS can also serve as a etch resistance layer so that it acts as a etch protection layer to define ultra-narrow material layer that resides beneath the VGMS by using reactive ion etch, chemical beam etching or sputtering. The VGMS that can be used to perform double pattern lithography as is currently done with dielectric or carbon spacer on the sidewalls of define patterns.

Thus, the present invention provides methods for forming graphene directly on a surface without having to use the conventional approach of forming a graphene material layer on a second substrate and then transferring the graphene from the second substrate to a first substrate.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A method for forming a vertical graphene material structure on a substrate surface, comprising the steps of:
   forming a substrate;
   depositing a carbon or a carbon-containing material (CCCM) layer on the surface of the substrate;
   depositing a patterned metal material layer of a patterned metal material on the CCCM layer to form a CCCM/patterned metal material layer structure, the patterned metal material layer having a bottom surface in contact with the CCCM and further having top and side surfaces not in contact with the CCCM;
   applying a heating/cooling cycle to the CCCM/patterned metal material layer structure to diffuse carbon from the CCCM into the patterned metal material to form a carbon-containing patterned metal material layer, the CCCM being wholly or partially consumed during the heating/cooling cycle;
   cooling the carbon-containing patterned metal material layer to precipitate carbon out of the carbon-containing metal material layer to form a first graphene material (GM) on the bottom surface of the carbon-containing patterned metal material layer adjacent to the substrate and to form a second graphene material (GM2) on a top surface and at least one side of the carbon-containing patterned metal material layer;
   removing the carbon-containing metal material layer without removing the GM; and
   removing any remaining CCCM layer not consumed during the heating/cooling cycle;
   wherein the GM remains on the surface of the substrate; and
   removing the GM2 from the top surface of the carbon-containing patterned metal material layer but not removing the GM2 from the least one side of the metal material layer;
   wherein the GM2 that is not removed comprises the vertical graphene material structure.

2. The method according to claim 1, wherein the substrate is selected from the group consisting of silicon, sapphire, silicon-on-insulator, quartz, gallium arsenide, gallium nitride, indium phosphide, and cadmium telluride.

3. The method according to claim 1, wherein the metal material is selected based on one of a solubility limit of carbon in the metal material and a diffusion characteristic of carbon in the metal material.

4. The method according to claim 1, wherein the metal material comprises one of copper, nickel, ruthenium, cobalt, iron, and zinc.

5. The method according to claim 1, wherein the metal material layer is a nanoparticle metal material layer.

6. The method according to claim 1, wherein the heating/cooling cycle is a rapid thermal anneal.

7. The method according to claim 1, wherein forming the substrate further comprises depositing a material layer on a top surface of the substrate to provide the substrate surface, before deposition of the metal material.

8. The method according to claim 7, wherein the material layer comprises one of aluminum oxide, boron nitride, silicon nitride, silicon oxide, hafnium oxide, aluminum nitride, aluminum gallium nitride, gallium nitride, aluminum gallium arsenide, indium gallium arsenide, cadmium telluride, organic light emitting diode material, material as substrate for touch screen, thin film of photovoltaic material, thin film of material for display, barrier metal, and titanium nitride.

* * * * *